United States Patent
Bessyo et al.

(10) Patent No.: US 6,362,463 B1
(45) Date of Patent: Mar. 26, 2002

(54) HIGH FREQUENCY HEATING APPARATUS

(75) Inventors: Daisuke Bessyo; Kenji Yasui, both of Nara; Kazuho Sakamoto, Kyoto; Makoto Mihara; Shinichi Sakai, both of Nara; Haruo Suenaga, Osaka; Yoshiaki Ishio; Hiokaki Moriya, both of Nara; Hidetomo Nagata, Tochigi; Hideki Omori, Hyogo, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/762,334

(22) PCT Filed: Aug. 2, 1999

(86) PCT No.: PCT/JP99/04176

§ 371 Date: Apr. 26, 2001

§ 102(e) Date: Apr. 26, 2001

(87) PCT Pub. No.: WO00/08898

PCT Pub. Date: Feb. 17, 2000

(30) Foreign Application Priority Data

| Aug. 6, 1998 | (JP) | 10-222977 |
| Oct. 16, 1998 | (JP) | 10-294938 |
| Oct. 26, 1998 | (JP) | 10-303588 |
| Nov. 9, 1998 | (JP) | 10-317400 |
| Nov. 26, 1998 | (JP) | 10-335408 |
| Dec. 16, 1998 | (JP) | 10-357529 |

(51) Int. Cl.$^7$ .................... H05B 6/68
(52) U.S. Cl. ............ 219/715; 219/716; 219/723; 363/17; 363/98
(58) Field of Search ............ 219/702, 715, 219/716, 723, 721; 363/17, 21, 97, 98, 16

(56) References Cited

U.S. PATENT DOCUMENTS

| 4,549,054 A | 10/1985 | Aoyama |
| 4,933,830 A | * 6/1990 | Sato et al. ........... 219/716 |
| 5,274,208 A | * 12/1993 | Noda .................... 219/715 |
| 5,639,395 A | 6/1997 | Lee |
| 5,644,479 A | * 7/1997 | Yoshida et al. ....... 363/16 |

FOREIGN PATENT DOCUMENTS

| EP | 0 279 514 | 8/1988 | |
| EP | 0 364 040 | 4/1990 | |
| EP | 0 477 633 | 4/1992 | |
| JP | 6-36871 | * 2/1994 | 219/715 |
| JP | 09283270 | 10/1997 | |
| WO | WO 98/38836 | 9/1998 | |

* cited by examiner

*Primary Examiner*—Philip H. Leung
(74) *Attorney, Agent, or Firm*—Ratner & Prestia

(57) ABSTRACT

A high frequency heating apparatus including a circuit for driving a magnetron. A circuit comprises a leakage transformer, a second capacitor connected in series to primary coil of said leakage transformer, a second switching device connected in parallel with a series circuit of said primary coil and second capacitor, a first capacitor connected in parallel with said second switching device, and a first switching device connected in series to said second switching device. Under a structure of the present invention, the switching device and the leakage transformer, both being the key components of the circuit, may respectively be used in common either on a circuit of 200V–240V commercial power supply or on a circuit of 100V–120V commercial power supply. This enables volume production of the key components, which leads to a benefit of reduced cost of the components as well as the cost of heating apparatus.

23 Claims, 25 Drawing Sheets

FIG. 3(a) Mode 1
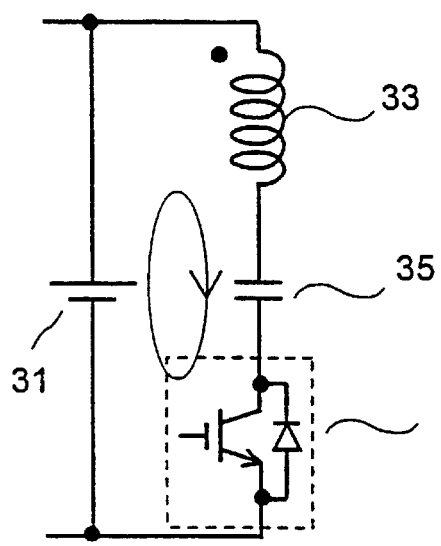
FIG. 3(b) Mode 2
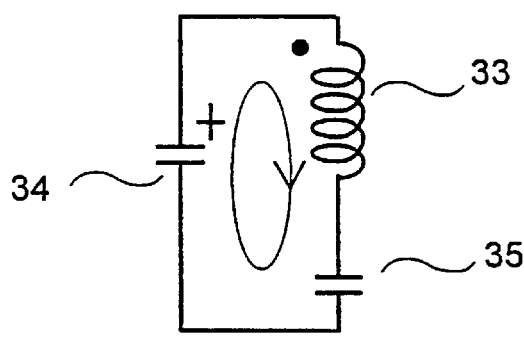
FIG. 3(c) Mode 3
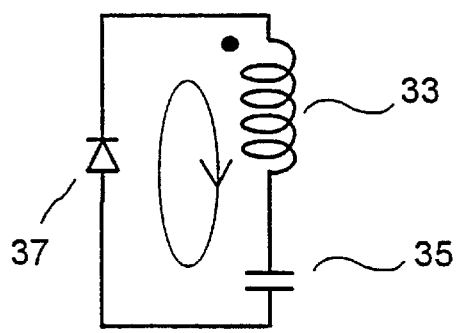
FIG. 3(d) Mode 4
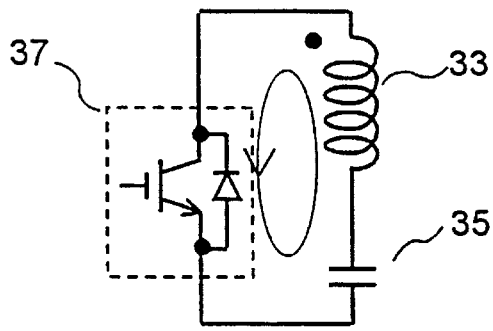
FIG. 3(e) Mode 5
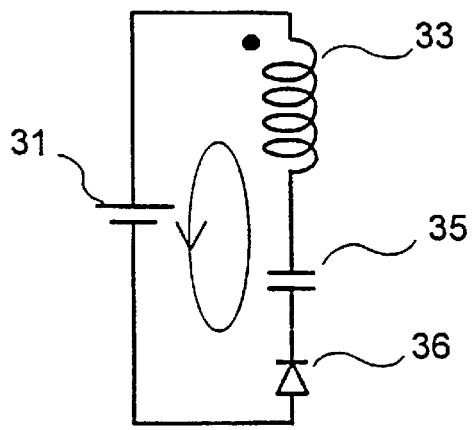
FIG. 3(f) Mode 6
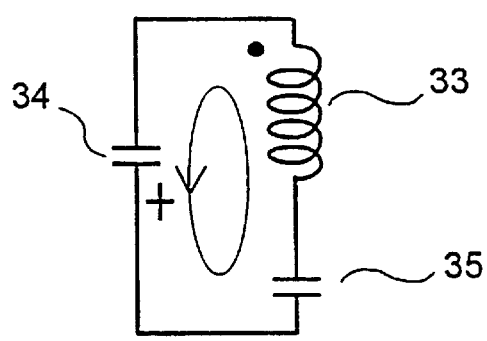

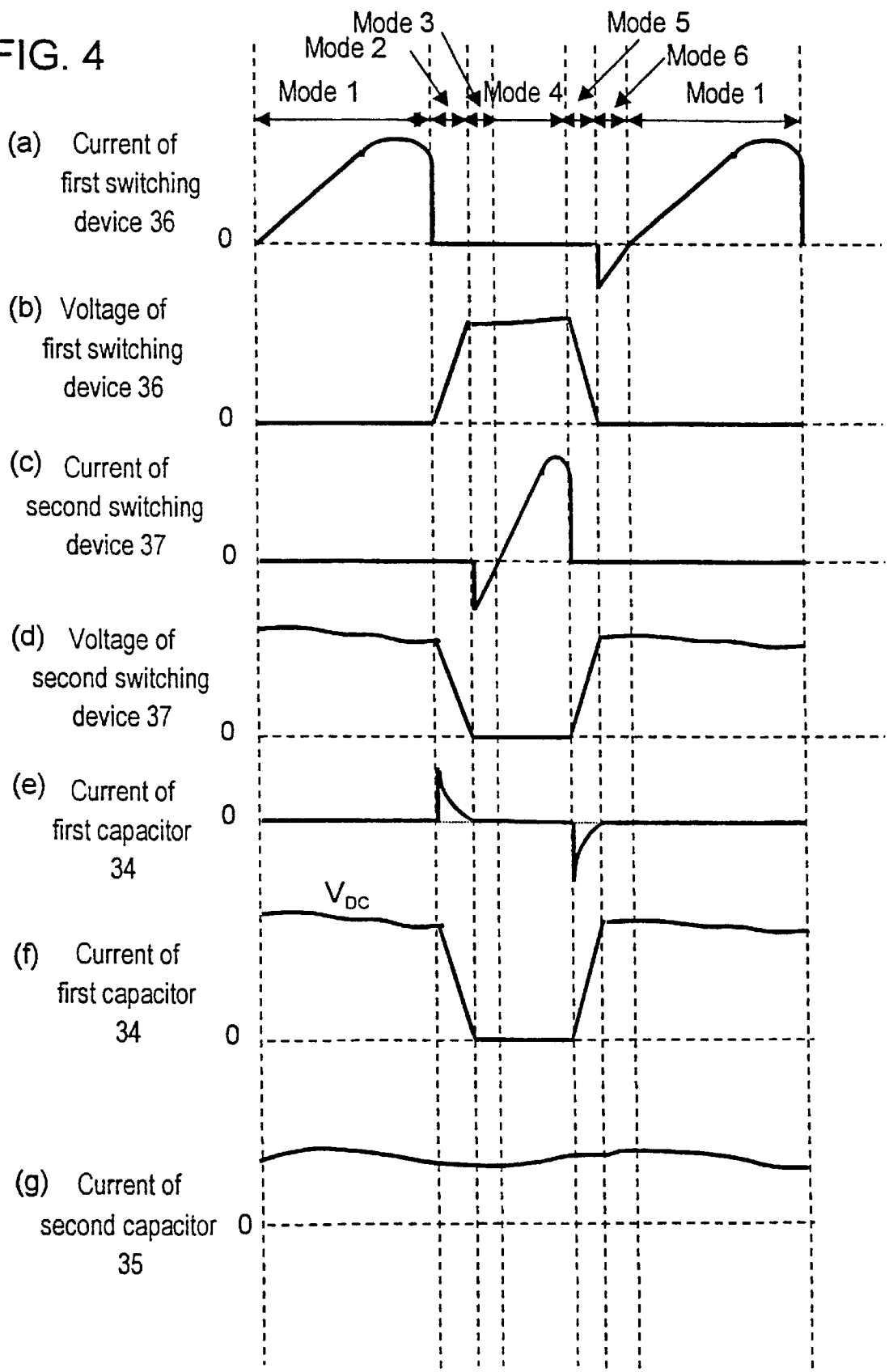

K : Magnetic coupling coefficient
$L_1$: Primary coil inductance
R : Equivalent resistance of magnetron
n : $n=\sqrt{(L2/(k^2 \times L_1))}$
$L_2$: Secondary coil inductance (a) Output of voltage detecting section (b) Output of pulse width modulating section (a) Output of voltage detecting section (b) Output of pulse width modulating section (c) Output of frequency modulation section

HIGH FREQUENCY HEATING APPARATUS

This application is a U.S. National Phase Application of PCT International Application PCT/JP99/04176.

TECHNICAL FIELD

The present invention relates to a high frequency heating apparatus that performs induction heating using a magnetron, for example a microwave-cooking oven; more specifically to the structure of a circuit for driving a magnetron.

BACKGROUND ART

The power supply circuit incorporated in a home-use high frequency heating apparatus and various other such apparatus is bulky and heavy in weight. Reduction in size and weight of the power supply circuit has been one of the main tasks in the industry. Efforts have been made in many sectors to make it compact, light and inexpensive through adoption of the switching power supply. Also in the field of food processing high frequency heating apparatus using a magnetron, the magnetron driving circuit is requested to reduce its size and weight. There is a patent that intends to meet the requirement through introduction of the switching power supply (PCT/JP98/00751).

According to the above patent, the switching loss of semiconductor switching devices operating at high frequency is reduced through adoption of a resonance type circuit, which circuit being an essential technology in the switching power supply. Because of a high voltage in the circuit generated by the functioning of resonance circuit, the semiconductor switching devices and other relevant electric components are required to have high voltage specifications. This makes the circuit large and heavy. In order to evade such problems the above patent discloses the following structure.

As shown in FIG. 28, a conventional circuit comprises a DC source 1, a leakage transformer 2 connected to one end of the DC source 1, a first semiconductor switching device 6 connected in series to a primary coil 3 of the leakage transformer 2 and to the other end of the DC source, a first capacitor 4 connected in parallel with the primary coil 3 of the leakage transformer 2, a series circuit of a second capacitor 5 and a second semiconductor switching device 7, driving means 8 having an oscillator for driving the first semiconductor switching device 6 and the second semiconductor switching device 7, rectifying means 10 connected to a secondary coil 9 of the leakage transformer 2, and a magnetron 11 connected to the rectifying means 10. The series circuit of the second capacitor 5 and the second semiconductor switching device 7 is connected in parallel with the primary coil 3 of the leakage transformer 2.

A feature of the above circuit structure is that a voltage to be applied on the main first semiconductor switching device 6 can be lowered by the use of an auxiliary second capacitor 5 that has a capacitance greater than that of the first capacitor 4 which forms a resonance circuit in combination with the leakage transformer 2.

Thinking of cases where the DC source 1 is provided by rectifying a commercial power supply. The commercial power supply comes in different voltages, for example 100V in Japan, 120V in the U.S., 240V in the UK and Peoples Republic of China, 220V in Germany. Even within Japan, many of the power consuming professional apparatus receive the power supply at 200V.

In a case where the commercial supply voltage is 100V or 120V, the voltage to be applied on the main first switching device 6 may be reduced by the above described circuit. However, if voltage of the commercial power supply is higher than 200V, the voltage to the main first switching device 6 goes high in the circuit disclosed by the above patent. Also, it is necessary to change inductance of the primary coil and the secondary coil of leakage transformer 2, as well as capacitance of the first capacitor 4 and the second capacitor 5.

Table 1 compares the constants of the leakage transformer 2, the first capacitor 4 and the second capacitor 5, and the voltages on the first switching device 6 in the 100V power supply and the 200V power supply. Table 1 teaches us, for example, that the inductance of primary coil of leakage transformer 2 increases to approximately 4 times, the number of coil turns increases, in proportion to the square root of inductance, to approximately two times. Thus the structure undergoes a substantial change.

Also, the withstand voltage of the first switching device 6 has to be raised to meet the two-fold voltage to be applied thereon.

The conventional circuit has two problems when it encounters a commercial power supply higher than 200V. One problem is that the voltage applied on the switching device goes high, the other problem is that the leakage transformer, the first capacitor and the second capacitor are compelled to have different constants respectively.

The conventional circuit is described further referring to FIG. 28. A parallel resonance circuit formed of the leakage transformer 2, the first capacitor 4 and the second capacitor 5 makes the voltage of primary coil 3 to be higher than the DC source voltage by the resonance effect.

Therefore, when the DC source is provided from a high voltage commercial power supply, the voltage of primary coil 3 goes still higher. So, it becomes necessary to lower the step-up ratio of leakage transformer 2 (ratio in the number of turns between the primary coil 3 and the secondary coil 9), and to increase the number of turns of primary coil 3 in order to lower the voltage of primary coil 3.

TABLE 1

|  | 100 V | 200 V |
| --- | --- | --- |
| Leakage transformer |  |  |
| Primary coil inductance | 45 $\mu$H | 150 $\mu$H |
| Secondary coil inductance | 14 mH | 8 mH |
| Coupling coefficient of Primary-Secondary coils | 0.74 | 0.74 |
| First capacitor capacitance | 0.18 $\mu$F | 0.05 $\mu$F |
| Second capacitor capacitance | 4.5 $\mu$F | 4.5 $\mu$F |
| Voltage on first switching device | 430 V | 930 V |

The DC source 1 is composed of rectifying means for rectifying commercial power supply and a filter formed of an inductor and a capacitor to smooth the output.

The filter smoothes the voltage, removes a noise generated as a result of switching operation by switching device and avoids intrusion of a noise from outside.

However, the filter formed of an inductor and a capacitor generates an overvoltage twice as high as that of the DC source at the moment when the power is on.

There is another problem that is related with a sudden change of impedance caused by a discharge started within magnetron tube. Relationship between primary coil 3 and secondary coil 9 of the leakage transformer 2 is shown in FIG. 32(a), in the form of an equivalent circuit diagram. The primary coil 3 may be divided into a leakage inductor and an exciting inductor; further the exciting inductor and the secondary coil 9 magnetically coupled with an ideal transformer (magnetic coupling coefficient 1). Both ends of the secondary coil are connected with the rectifier circuit, the rectifier circuit is connected to a magnetron. In the drawing, $L_1$ represents inductance of the primary coil, $L_2$ inductance of the secondary coil.

When impedance of a magnetron becomes extremely small to an equivalence of short-circuiting of the secondary coil, an equivalent circuit of leakage transformer 2 is as shown in FIG. 32(*b*). There is only a leakage inductor. The inductance L of which is given by the formula below.

$$L=(1-k^2)\times L_1 \qquad \text{(Formula 1)}$$

where:
  $L_1$ is inductance of primary coil
  k is coefficient of magnetic coupling between primary coil and secondary coil When the secondary coil 9 is short-circuited, inductance of primary coil becomes small. Therefore, a large current as shown in Formula 2 flows to the first switching device 6.

$$I_c=V_{DC}\times T_{on}/L \quad (1) \qquad \text{(Formula 2)}$$

$V_{DC}$: output voltage of DC source 1
$T_{on}$: Time of conduction in the first switching device 4

Because of the small L the current is an overcurrent; furthermore, an overvoltage is generated when the first switching device 6 turns OFF. Thus the first switching device 6 is given with a great stress by the overcurrent and the overvoltage emerging continuously.

Still, there is a following problem with respect to driving of a magnetron. An appropriate temperature for magnetron cathode is approximately 2100° K. If the cathode temperature is not appropriate, the magnetron is unable to operate and impedance between anode and cathode is greater then 100MΩ. When a cathode is in an appropriate temperature, the constant voltage characteristics of magnetron keeps the voltage between anode and cathode at −4 kV. As the cathode heating current is delivered from a tertiary coil 26 of leakage transformer, as shown in FIG. 28, a state of high impedance between the anode and the cathode at the start-up lasts until the cathode temperature reaches the appropriate level. During the state, the constant voltage characteristics do not exist between the anode and the cathode, and a voltage higher than −4 kV is generated.

The rectifier and the filter forming the DC source 1, the first switching device 6, the second switching device 7, the first capacitor 4, the second capacitor 5, the driving means 8, the leakage transformer 2 and the rectifying means 10 are normally disposed on a same printed circuit board for the sake of compactness. FIG. 29 shows structure of a printed circuit board 12. The rectifying means 10 is connected with the secondary coil 9 of leakage transformer 2, while the other electric components are connected with the primary coil 3; and the former and the latter are insulated with each other.

However, if some of these components are mounted aslant or they are tilted later by an external force, there is a possibility that the electric components forming the rectifying means 10 and those connected with the primary coil 3 of leakage transformer 2 might come into contact with each other. In order to avoid such a contact to happen, following means are taken.

As illustrated in FIG. 29, a high withstand voltage diode 13, which being an electric component pertaining to the rectifying means 10, is disposed away from the first capacitor 4, with a distance long enough not to cause mutual contact even if they topple.

The electric components to be connected with the primary coil of leakage transformer 2 are molded, in order that they do not fall down even if a certain external force is given to. Or, a barrier is provided between components for supporting a toppled component, if any, in order that it does not fall down among the other components. The electric components are mounted and fixed with glue. These are some of the methods taken in the conventional configuration to avoid the troubles.

Conventional measures taken to prevent electric components on a printed circuit board from making mutual contact by an accidental force, or to prevent those components that were mounted oblique by mistake of an assembly person from making mutual contact at a later stage, have following drawbacks. Problem 1; mounting the components on a board with a sufficient inter-space enough to avoid mutual contacting even if they fall down takes too much board space, makes it difficult to reduce the board size. Problem 2; molding the components for higher insulating capability means an extra cost needed for providing the additional processing on finished components. Problem 3; providing an insulation board between the high voltage circuit and the low voltage circuit makes assembly of printed circuit board difficult, hence a higher cost. Problem 4; fixing the components by gluing takes longer assembly work hour, and effectiveness of the gluing does not necessarily last long.

A magnetron is disposed in a place apart from a printed circuit board on which electric components for the driving circuit are mounted. So the anode and the cathode of a magnetron need to be connected with the printed circuit board by some means. Cathode is connected to the printed circuit board with a lead wire, while anode is connected to the printed circuit board through a metal cabinet of the high frequency heating apparatus.

As the body itself of a magnetron forms the anode, the electrical connection between anode and metal cabinet is completed by simply mounting and fastening a magnetron on the metal cabinet using a screw bolt.

Now, the electrical connection between the metal cabinet and the printed circuit board is described. The connection is a critical point. If by some reason the connection in this respect was forgotten in the assembly line, magnetron does not operate. Or, if the connection was incompletely made, a resulting contact resistance may generate heat, giving damage on the neighboring components, or in the worst case, the circuit board may be scorched.

The connecting means is described referring to the drawings. In FIG. 28, a first connection point 14 represents a point of connection between a pattern 16 of printed circuit board 12 (FIG. 30) and a point 14' which signifies metal cabinet of a high frequency heating apparatus, or a metal sheet 17 forming the cabinet (FIG. 30). FIG. 30 is a cross sectional view showing a connecting section of metal cabinet of a high frequency heating apparatus, or a metal sheet 17 forming the cabinet, and the printed circuit board 12. A cylindrical eyelet 18 inserted to a hole of printed circuit board 12 is fixed by solder 15 with a pattern 16 of the printed circuit board 12 to share a same electrical potential. The hole diameters of the eyelet 18 and the hole in the metal sheet are slightly smaller than the diameter of a tapping bolt 19. When the tapping bolt 19 is screwed tight, it proceeds cutting into part of the eyelet 18 and the metal sheet 17, and the solder 15 is fixed firmly onto the metal sheet 17. Thus, the pattern 16 and the metal sheet 17 have a sure electrical connection with each other.

FIG. 31 shows the printed circuit board 12 mounted with electric components, as viewed from the top. The printed circuit board 12 is provided with as many as five holes 20, 21, 22, 23 and 24 in the edge portion for fixing, because it bears on it relatively heavy substance such as the leakage transformer. And a resin frame is provided for protecting the printed circuit board from a damage that could be caused by vibration, shock by a drop, etc. during transportation. The above described hole with eyelet is indicated by numeral 25.

A practical weak point with the conventional assembly operation of printed circuit board is that, because there are a plurality of holes to be fastened with screw bolt in a board, an assembly person on the production line might forget to put a screw bolt in the functionally important hole provided with eyelet.

DISCLOSURE OF THE INVENTION

A circuit in accordance with the present invention comprises a DC source, a leakage transformer connected to the positive terminal of the DC source, a second capacitor connected in series to primary coil of the leakage transformer, a second switching device connected to the positive terminal of the DC source, a first capacitor connected in parallel with the second switching device, a first switching device connected in series to the second switching device and connected to the negative terminal of the DC source, driving means for driving the first and the second switching device, rectifying means connected to the secondary coil of the leakage transformer, and a magnetron connected to the rectifying means.

The series connection of primary coil of the leakage transformer and the second capacitor divides the DC source voltage, leading to reduced voltage to be applied on the first and second semiconductor switching devices. And, the circuit of the present invention may use a leakage transformer, a first capacitor and a second capacitor whose respective constants are substantially identical to those in conventional circuits.

A surge absorber provided at the output of a filter forming the DC source absorbs an overvoltage. As the overvoltage is a transient phenomenon and the output voltage of filter quickly returns to the steady voltage (DC source voltage), the surge absorber does not keep absorbing the overvoltage.

Other exemplary structure the circuit is connecting a point of connection between primary coil of the leakage transformer and the second capacitor to one end of the DC source with a first resistor, and the point of connection to with the other end of the DC source with a second resistor for detecting the voltage of primary coil of the leakage transformer. Based on the detection, generation of overvoltage at the start-up in the secondary coil of the leakage transformer can be controlled.

Furthermore, in order to prevent electric components on a printed circuit board from falling down to make contact with other electric components, an anti-toppling tool may be provided at the foot of the electric components. With the above described setup, it becomes unnecessary to provide additional treatment on finished components or extra interspace between the components, as practiced in conventional circuits. Therefore, a printed circuit board can be made smaller and cheaper.

BRIEF DESCRIPTION OF THE DRAWINGS

FIGS. 3(a)–(f) show the circuit of FIG. 1 in operating modes 1–6.

FIG. 4 is a waveform chart showing the voltage and the current in the circuit of FIG. 1.

FIG. 10(a) is a voltage waveform chart of an output from voltage detection section, FIG. 10(b) is a voltage waveform chart of an output from pulse width modulation section.

FIG. 12(a) is a voltage waveform chart of an output from voltage detection section, FIG. 12(b) is a voltage wave form chart of an output from pulse width modulation section, FIG. 12(c) is a voltage waveform chart of an output from frequency modulation section.

FIG. 15(a) shows a voltage waveform of an output from voltage detection circuit under output control, FIG. 15(b) shows a voltage waveform of an output from pulse width modulation circuit, FIG. 15(c) shows a voltage waveform of an output from frequency modulation circuit.

DESCRIPTION OF THE PREFERRED EMBODIMENTS

First Exemplary Embodiment

Figure 1:
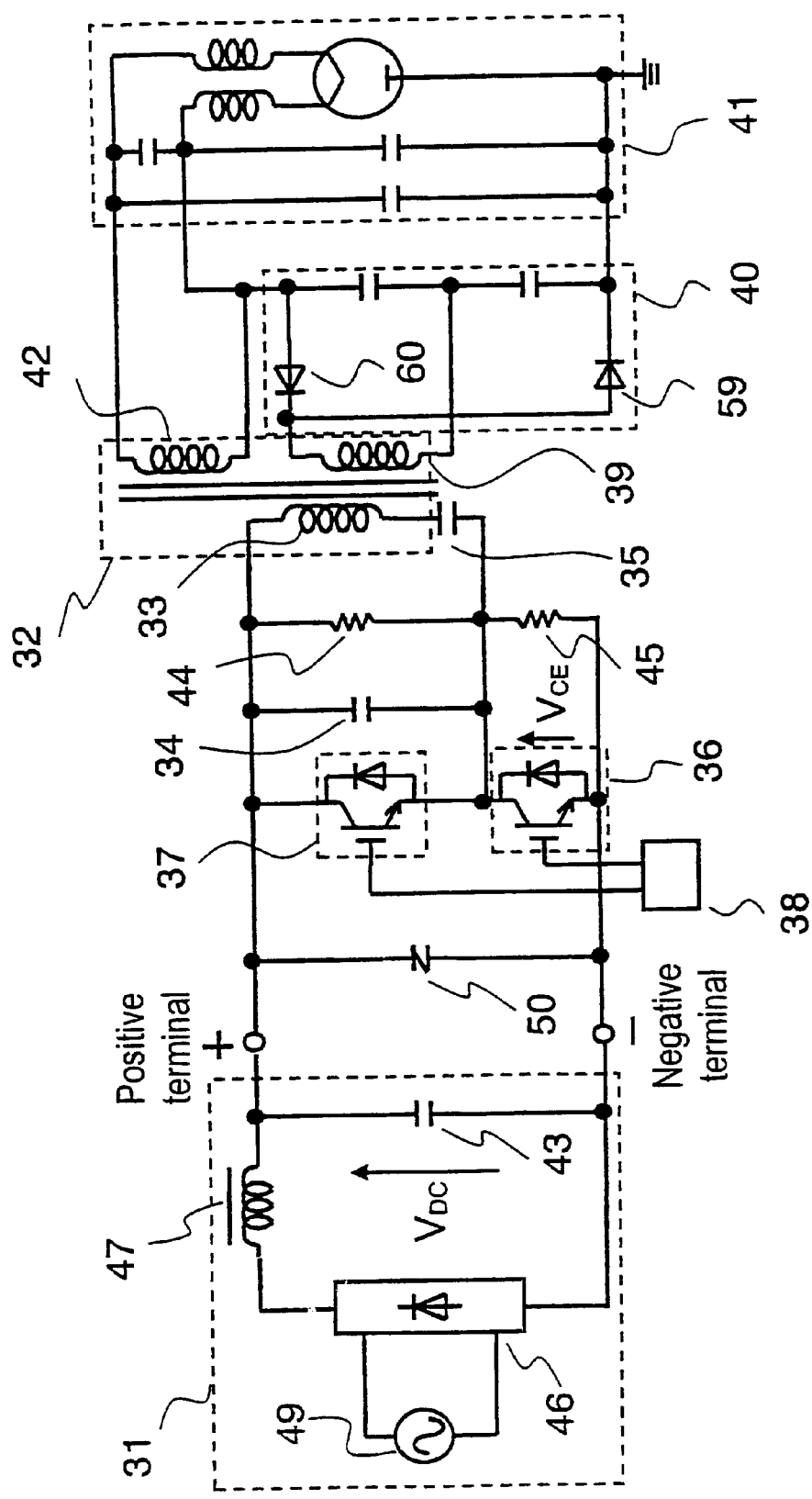
FIG. 1 is a diagram of magnetron driving circuit used in a high frequency heating apparatus, in accordance with a first, a seventh and an eighth exemplary embodiments of the present invention.
Figure 2A:
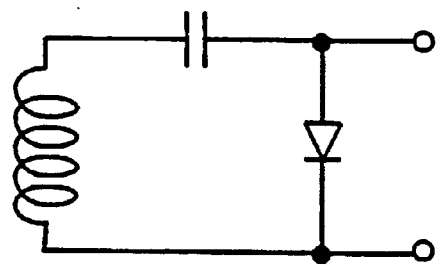
FIGS. 2(a)–(c) show examples of rectifier circuits of the secondary coil of leakage transformer, in accordance with the first exemplary embodiment of the present invention.
Figure 2B:
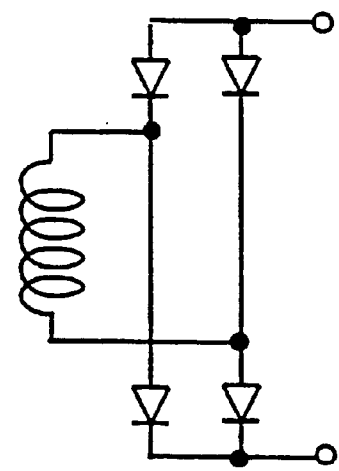
Figure 2C:
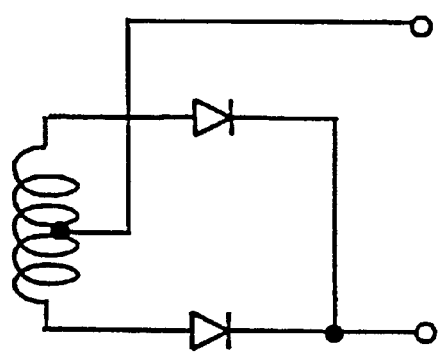

FIG. 1 shows a magnetron driving circuit of a high frequency heating apparatus in accordance with a first exemplary embodiment of the present invention. The driving circuit comprises a DC source 31, a leakage transformer 32, a first switching device 36, a first capacitor 34, a second capacitor 35, a second switching device 37, driving means 38, a full-wave voltage-doubling rectifier circuit 40 and a magnetron 41. The DC source 31 provides a DC voltage $V_{DC}$ obtained by full-wave rectifying a commercial power supply to a series circuit formed of the second capacitor 35, a primary coil 33 of the leakage transformer 32 and a first semiconductor switching device 36. The first switching device 36 and the second switching device 37 are connected in series, the series circuit formed of the primary coil 33 of leakage transformer 32 and the second capacitor 35 is connected in parallel with the second switching device 37. The first capacitor 34 is connected in parallel with the second switching device 37. A high voltage output generated at the secondary coil 39 of leakage transformer 32 is converted into a high DC voltage by the full-wave voltage-doubling rectifier circuit 40, and applied between an anode and a cathode of the magnetron 41. A tertiary coil 42 of leakage transformer 32 delivers current to the cathode of magnetron 41. Conditions for driving a magnetron 41 is disclosed in the above patent (PCT/JP98/00751), so only an outline is described here. The magnetron is provided with a negative voltage. During operation of a magnetron, the constant voltage characteristics keep the voltage at approximately −4 kV. In order to effectively use the positive voltage generated at leakage transformer 32, the rectifying means chooses either the full-wave voltage-doubling rectifying circuit as shown in FIG. 1, the half-wave voltage-doubling rectifying circuit of FIG. 2(a), the full-wave rectifying circuit of FIG. 2(b) or the center tapped rectifying circuit of FIG. 2(c).

The first switching device 36 is formed of an IGBT and a diode connected in parallel with it. The second switching device 37 is likewise formed of an IGBT and a diode. The driving means 38 contains in it an oscillator for providing driving signal to the first switching device 36 and the second switching device 37. Signal of a certain specific frequency and duty generated in the oscillator is delivered to the first switching device 36 as the drive signal.

The second switching device 37 is provided with a signal reverse to the driving signal delivered to first switching device 36, added with a delay time.

Operation of the circuit of FIG. 1 may be divided into six modes described in FIG. 3. The operation is described referring to FIG. 3 and FIG. 4, where the voltage/current waveforms of switching devices 36 and 37 are shown. In mode 1 (FIG. 3(a)), when the switching device 36 is provided with a drive signal, current from the DC source 31 flows through the primary coil of leakage transformer 32 and the second capacitor 35. In mode 2 (FIG. 3(b)), the first switching device 36 turns OFF, and the current flowing through the primary coil 33 and the second capacitor 35 starts going towards the first capacitor 34. At the same time, the voltage at first switching device 36 goes up. In mode 3 (FIG. 3(c)), voltage of the first capacitor 34 goes from $V_{DC}$ towards 0V. In the mode 3, voltage of the first capacitor 34 reaches 0V, and a diode constituting the second switching device 37 turns ON. In mode 4 (FIG. 3(d)), direction of the current flowing through the primary coil 33 and the second capacitor 35 is reversed by resonance; therefore, the second switching device 37 needs to be in ON state at this moment. During the modes 3 and 4, the voltage of first switching device 36 becomes identical to the DC source voltage $V_{DC}$. In the area where the effective value of commercial power supply is 230V, for example in European countries, the peak voltage becomes root 2 times, and the peak voltage of DC source $V_{DC}$ becomes approximately 325V. In mode 5 (FIG. 3(e)), the second switching device 37 turns OFF, the current flowing through second capacitor 35 and primary coil 33 starts going towards the first capacitor 34, and the voltage of first capacitor 34 goes up to $V_{DC}$. In mode 6 (FIG. 3(f)), the voltage of first capacitor 34 reaches $V_{DC}$, and a diode constituting the first switching device 36 turns ON. Direction of the current flowing through the primary coil 33 and the second capacitor 35 is reversed by resonance; the first switching device 36 needs to be in ON state at this moment. This is the mode 1. During the modes 6 and 1, the voltage of second switching device 37 is identical to the DC source voltage $V_{DC}$.

The effects of the present embodiment are as follows.

Firstly, the highest value of a voltage to be applied on the first switching device 36 and the second switching device 37 can be made identical to the DC source voltage $V_{DC}$.

Secondly, switching loss of the switching device can be reduced by the resonance system. Outline of this point is described below. Modes 2 and 5 are the resonance period, during which the current from the primary coil 33 flows to first capacitor 34 and second capacitor 35. Capacitance of the first capacitor 34 is approximately ⅟20 to ⅟30 of that of the second capacitor 35; therefore, the composite capacitance is close to that of the first capacitor 35. The voltage applied on first switching device 36 and second switching device 37 during modes 2, 5 varies along with a time constant determined by the composite capacitance and the impedance of leakage transformer 33. The voltage shift with an inclination determined by the above described time constant decreases the switching loss of first switching device 36 during OFF period in mode 2. Furthermore, the voltage applied on first switching device 36 in mode 5 becomes zero, which decreases the switching loss of first switching device 36 during ON state. This is called a zero voltage switching, and these are the feature of the resonance circuit system. The present method utilizes the feature, while the voltage on switching device does not go beyond the DC source voltage $V_{DC}$.

Thirdly, the magnetrons are driven with the negative voltage. The positive voltage generated at leakage transformer 2 can be effectively utilized by selecting a full-wave voltage-doubling rectifying circuit, a half-wave voltage-doubling rectifying circuit, a full-wave rectifying circuit or a center tapping rectifying circuit for the rectifying means.

Second Exemplary Embodiment

The second capacitor 35 has a sufficiently great capacitance so as to make the voltage ripple small, as shown in the bottom of FIG. 4. This is one of the points of significance with the present invention. Shown in Table 2 are leakage transformer 32, first capacitor 34, second capacitor 35, third capacitor 43 forming the filter DC source 31 and the operating frequency.

TABLE 2

| Leakage transformer | |
|---|---|
| Primary coil inductance | 45 µH |
| Secondary coil inductance | 14 mH |
| Coupling coefficient of Primary-Secondary coils | 0.74 |
| First capacitor capacitance | 0.18 µF |
| Second capacitor capacitance | 4.5 µF |
| Operating frequency | 35 kHz |

Figure 5:
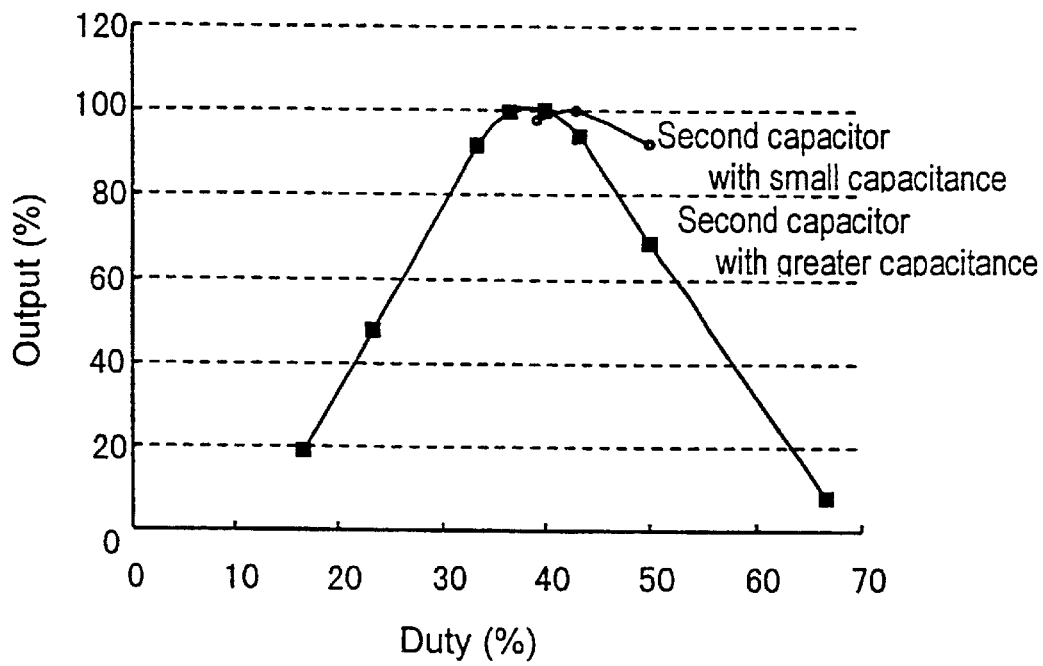
FIG. 5 is a chart used to describe a second exemplary embodiment, where an output characteristic in the circuit of FIG. 1 is shown.

Constants of the leakage transformer, the first capacitor and the second capacitor remain identical to those of leakage transformer, first capacitor and second capacitor shown in Table 1, which are used in a conventional circuit described in the Background Art. The second capacitor 35 has a great capacitance, approximately identical to that of the third capacitor 43. FIG. 5 is an output characteristic of the circuit of FIG. 1, showing the cases where the second capacitor 35 has a great capacitance (approximately identical to that of the third capacitor 43) i.e. the present case, and where it has a small capacitance (approximately half of that of the third capacitor 43).

The output characteristic of FIG. 5 represents a case where it is controlled by changing the ratio of ON time vs cycle (duty), while the drive signal cycle of first switching device 36 is fixed. Shown in FIG. 5 is the output characteristic within a range where the first switching device 36 can make the zero voltage switching. As seen from the FIG. 5, the greater the capacitance of second capacitor 35 the broader the range of output variation.

Figure 6:
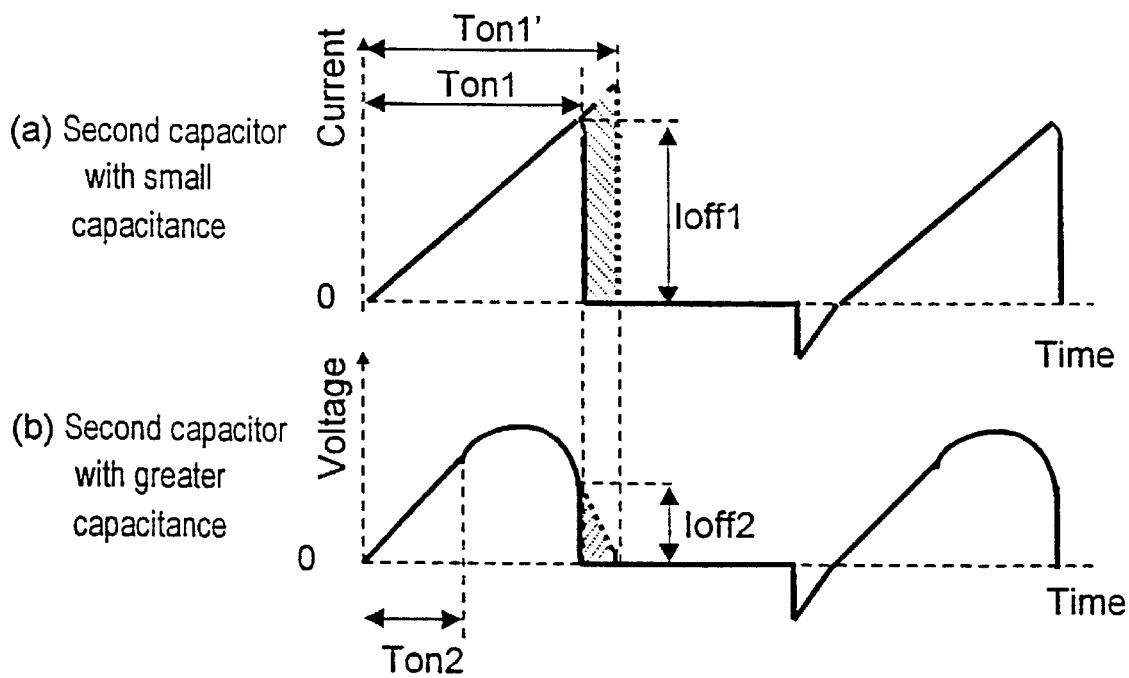
FIGS. 6(a) and 6(b) show current waveform charts of the first switching device, used to describe a second exemplary embodiment.

FIG. 6 compares waveform of the current flowing in the first switching device 36; with respect to the cases where capacitance of the second capacitor 35 is great and small. In the case where the capacitance is great, the current is seen in a tilted straight line form during the ON conduction period $T_{ON}$, while the waveform line takes a rounded form when the capacitance is small. From this state, if the ON conduction time is extended to $T_{ON1}$' the current increases linearly to have an increased area indicated with slant lines, when the capacitance is great. The area of current determines the amount of output. In the case where the capacitance is small, the area of increase is smaller relative to the case of great capacitance. Namely, the change of output remains small for an increase, or decrease, of ON conduction time. This represents that it is difficult to control an output through the conduction time (pulse width).

For enabling the output control through the conduction time (pulse width), the present embodiment chooses the capacitance $C_2$ of second capacitor, the inductance $L_1$ of primary coil of leakage transformer, the resonance frequency $f_R$ determined by the foregoing two factors, and the operating frequency $f_O$ to establish an appropriate relationship. The conditions to be met are:

$$f_R = 1/(2\times\pi\times\sqrt{(L_1\times C_2)}) \qquad \text{(Formula 3)}$$

$f_R$: resonance frequency

Also in the present embodiment, Capacitance $C_2$ of second capacitor 35, inductance $L_1$ of primary coil 33 of leakage transformer, resonance frequency $f_R$, and operating frequency $f_O$ fulfil Formula 4.

$$2.\ 45 < \sqrt{(L_1/C_2)} < 3.\ 55$$

$$1.\ 38 < f_O/f_R < 4 \qquad \text{(Formula 4)}$$

By assuming the above condition, the present embodiment controls the output through pulse width (duty). Furthermore, the output control through pulse width (duty) reduces variation of cathode current. This point is described below.

As shown in FIG. 1, the leakage transformer 32 comprises a tertiary coil 42, which supplies power for heating the cathode of a magnetron. The cathode of magnetron 41 is connected with a filter formed of an inductor and a capacitor for removing noise from cathode. The cathode, which being a resistor, has an impedance approximately 0.3Ω. Impedance of the inductor varies depending on operating frequency; it is 0.4Ω at 30 kHz, or almost identical to the cathode impedance. This means that the impedance of the inductor significantly influence the cathode current. Therefore, the above described phenomenon that an increased capacitance of second capacitor 35 broadens a variable range of output with a certain specific frequency also produces an effect of reducing the variation of cathode current.

Third Exemplary Embodiment

DC source of the present invention is provided by rectifying a 200V group commercial power supply. However, as described in Background Art voltage range of the commercial power supplies in the world spreads from approximately 200V to 240V. It is desirable that certain means of a similar category can control the output against varieties of commercial power supplies. However, it is difficult to overcome the voltage difference of 40V with an identical control means having identical circuit constant. The second capacitor 35 and the leakage transformer 32 are compelled to change their constants.

Figure 7:
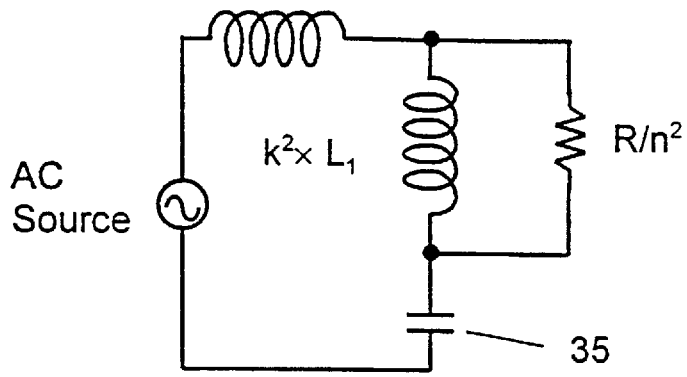
FIG. 7 is a simplified equivalent circuit of the second capacitor 35, the leakage transformer 32 and the magnetron 41, used to describe a third exemplary embodiment.
Figure 8:
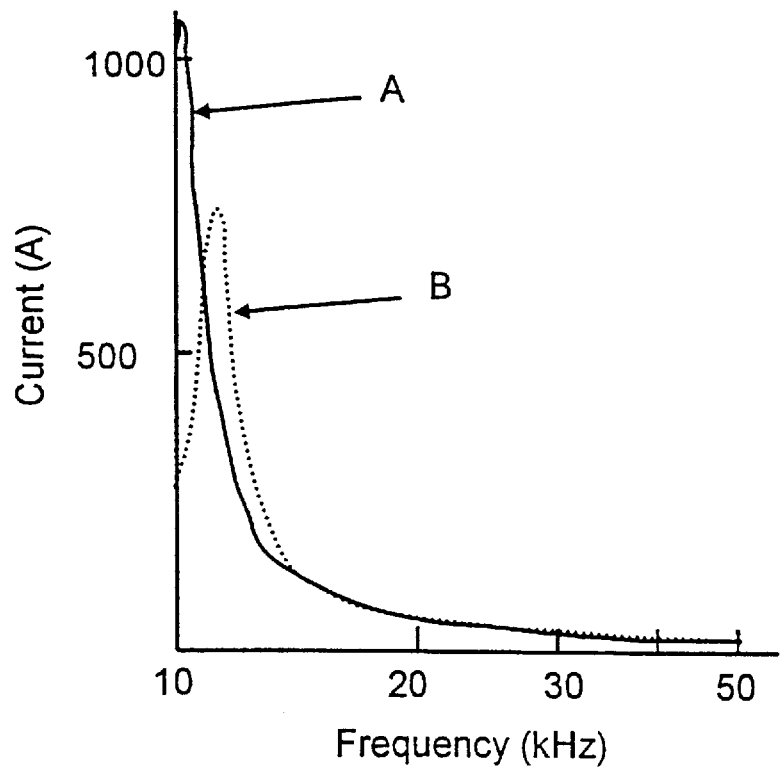
FIG. 8 is a characteristics chart showing a relationship between the frequency and the current of an AC signal source in the equivalent circuit of FIG. 7.

The second capacitor 35, the leakage transformer 32 and the magnetron 41 are shown simplified in an equivalent circuit in FIG. 7. The characteristic of AC source current of the FIG. 7 is shown in FIG. 8. Symbol A represents a case where capacitance of the second capacitor 35 is 4.5 $\mu F$, AC source voltage is 200V, and the constant of leakage transformer 32 are as shown in Table 2. Symbol B represents a case where capacitance of the second capacitor 35 is 4.5 $\mu F$, AC source voltage is 240V, and the constant of leakage transformer remains the same as in A. The operating frequency of the present circuit is in a range from 20 kH, which being higher than audible frequency, up to around 40 kH. Within the range, the characteristics in current and frequency of the AC source remain almost identical to each other with A and B. Thus, in a case of high supply voltage, the current characteristics in the range from 20 kH to 40 kH may be made approximately identical to each other by increasing the capacitance of second capacitor 35 to lower the resonance frequency. In a structure where the DC source derives from a commercial power supply and it is ranging from 200V to 240V, the current characteristics of a circuit may be kept identical by increasing capacitance of the second capacitor 35 according to the voltage increase of the commercial power supply, while using a leakage transformer 32 of the same constant.

Fourth Exemplary Embodiment

Figure 9:
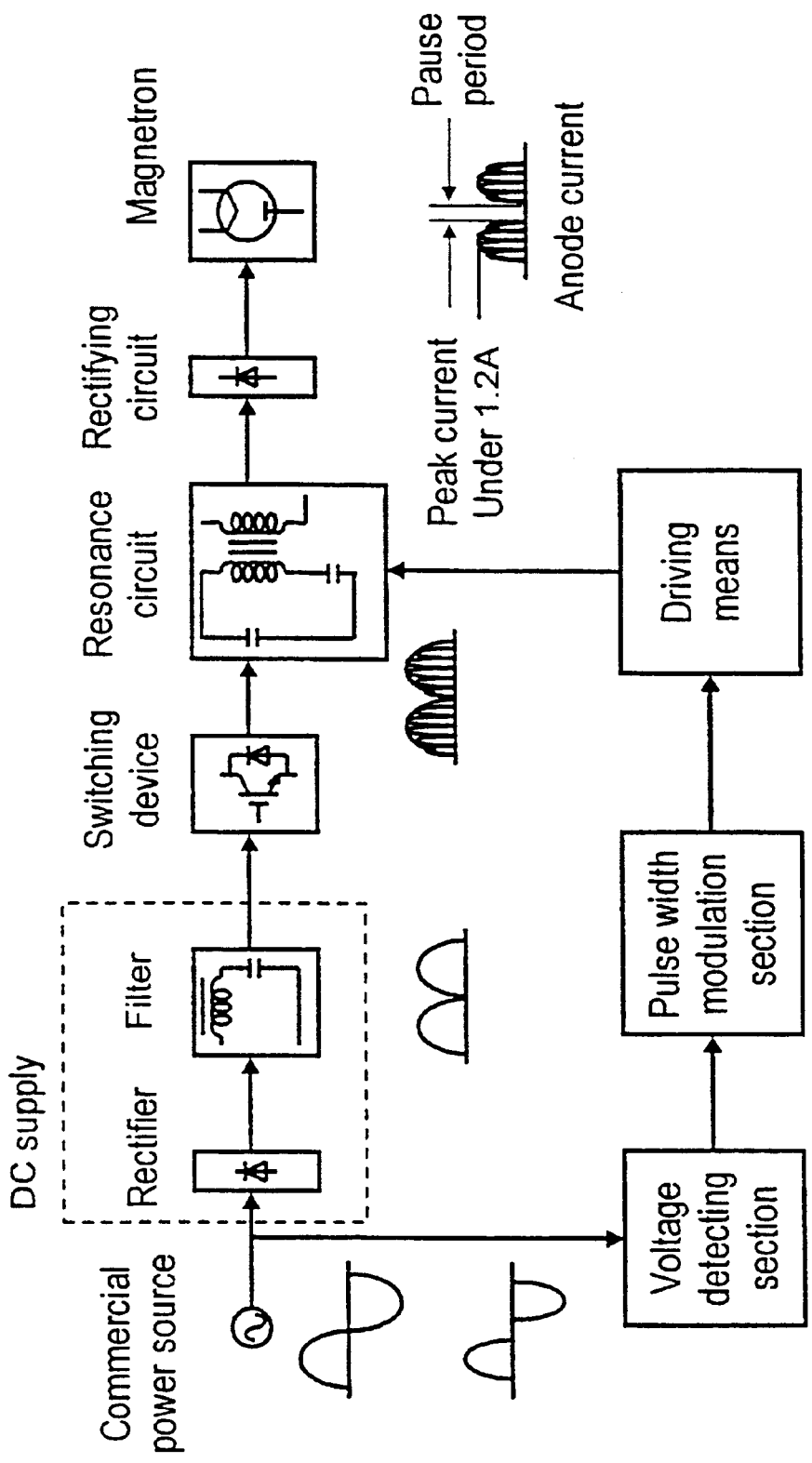
FIG. 9 is a circuit block diagram; where, the circuit of FIG. 1 is added with a pulse width modulation section, which being a content of the invention in a fourth exemplary embodiment. Electric components in the circuit are sorted to respective functional blocks, and voltage, or current, waveform at corresponding blocks is shown.

In obtaining a DC source from a commercial power supply, for example, when smoothing a full-wave rectified voltage with a capacitor, the greater the degree of smoothing the greater is the distortion in the commercial power supply in the current waveform. Therefore, the capacitance of a smoothing capacitor used in the present invention is made to be as small as possible. FIG. 9 is a circuit block diagram; where a content of the present invention is added to the circuit of FIG. 1, and then electric components are sorted into respective blocks, with a voltage, or current, waveform chart attached thereto. As shown in FIG. 9, the waveform of a full-wave rectified voltage derived from a commercial power supply has an envelope of the commercial power supply frequency. Such voltage is delivered to the subsequent switching device, resonance circuit and rectifying circuit for driving a magnetron, therefore the anode current waveform of the magnetron also assumes the envelope of commercial power supply frequency. As a magnetron oscillates at a voltage approximately –4 kV, it does not oscillate and have a pause period while the commercial power supply voltage is low. As a result, the anode current envelope is not continuous, consequently envelope of the current waveform of commercial power supply is not continuous. This creates a cause of distortion in the current waveform of commercial power supply. Therefore, the current pause period needs to be as short as possible.

The life of a magnetron is greatly dependent on peak value of anode current; the higher the current peak value the shorter is the life. Therefore, it needs to be suppressed to be lower than approximately 1.2 A.

In the present invention, duty of the switching device drive signal is varied in accordance with envelope of the commercial power supply voltage. Namely, the duty of first switching device 36 is made greater along with the lowering envelope voltage, for outputting the magnetron drive voltage, –4 kV, from the rectifier circuit. And the duty is made smaller along with the increasing envelope voltage so that the peak value of anode current does not exceed 1.2 A. As already described in embodiment 2, the relationship between output and duty is shown in FIG. 5. As the output reaches its peak at approximately 40% duty, practical operation is conducted within a range of duty from 16 to 40% in a configuration where the duty of first switching device 36 is made greater along with the lowering envelop voltage. In FIG. 9, there is a pulse width modulation section provided for increasing the duty of switching device 36 against the lowering envelope voltage. The pulse width modulation section uses an output from voltage detection section as the base signal.

Inside the pulse width modulation section, the base signal is reversed and amplified, and the amplification index is partially modified. This is because if a pulse width modulation signal is formed in line with the output from voltage detection circuit, the current waveform of commercial power supply assumes a shape almost trapezoidal, and a distortion became increased.

Figure 10:
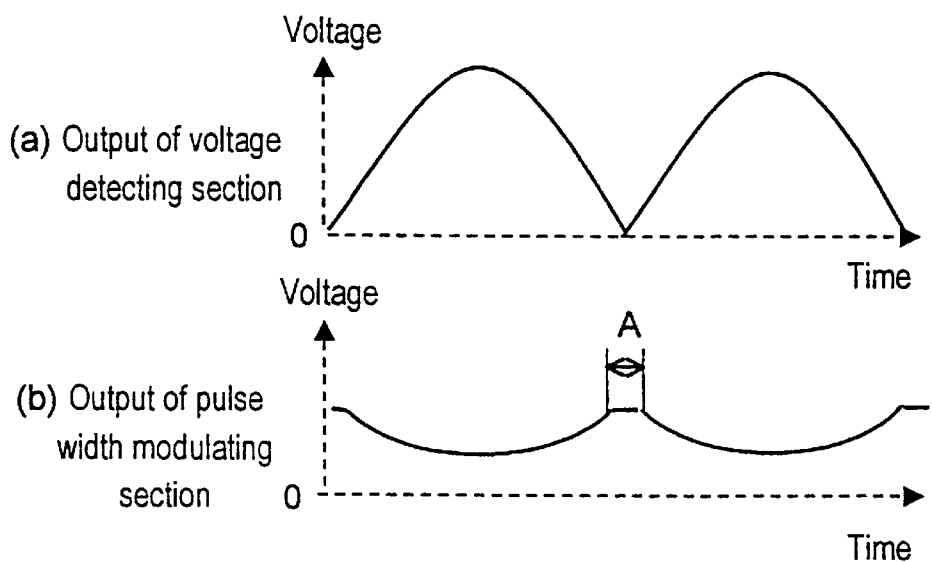
FIGS. 10(a) and 10(b) show waveform charts of the fourth exemplary embodiment.
Figure 11:
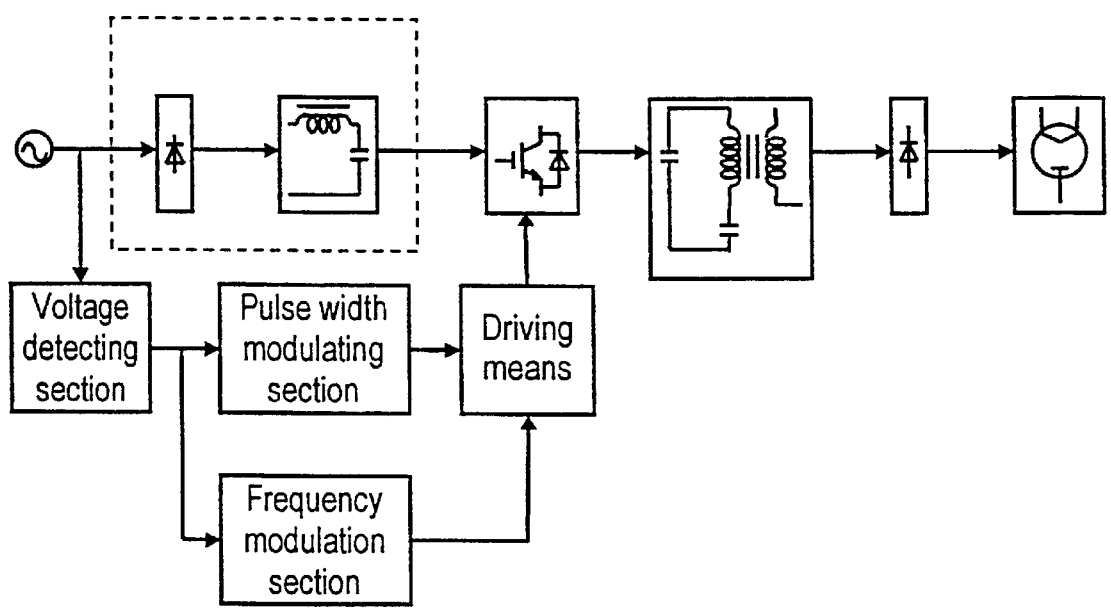
FIG. 11 is a circuit block diagram; where, the circuit of FIG. 9 is added with a frequency modulation section, which being a content of the invention in a fifth exemplary embodiment.

FIG. 10(a) shows a voltage waveform of an output from the voltage detection section corresponding to one cycle of commercial power supply, FIG. 10(b) shows a voltage waveform of an output from the pulse width modulation; the time axes of the above two charts are displayed with coincidence. The higher the voltage waveform of pulse width modulation output the greater is the duty for driving the first switching device.

As already described in the above, the output decreases when the duty goes above approximately 40%. Therefore, a limiting function is provided in the pulse width modulation section. In FIG. 10(b), during the period A the upper limitter controls the duty not going higher than approximately 40%. Thus, the circuit comprises a DC source derived from a commercial power supply, a source voltage detection section for detecting the voltage of the DC source, and a pulse width modulation section which uses an output from the source voltage detection section as the base signal. The signal from the pulse width modulation section is delivered to a driving section, the driving section drives a switching device in accordance with above signal. In this way, the pause period of commercial power supply current can be made short, and, also, the peak value of anode current can be lowered.

Fifth Exemplary Embodiment

A method of obtaining an output even in the low envelope voltage period has been described in the fourth exemplary embodiment. That is varying the duty of switching device driving signal in line with the envelope of commercial power supply voltage to make the duty of first switching device greater against the lowering envelope voltage.

The output may be adjusted not only through the duty but it may also be varied by the frequency. Operation frequency of the present circuit is in the neighborhood of 30 kHz. As seen in the characteristics chart of FIG. 8, the current increases as it comes closer to the resonance point of resonance circuit. Therefore, the output may be increased further by increasing the duty of switching device against the lowering envelope voltage, along with lowering the operating frequency.

Figure 13:
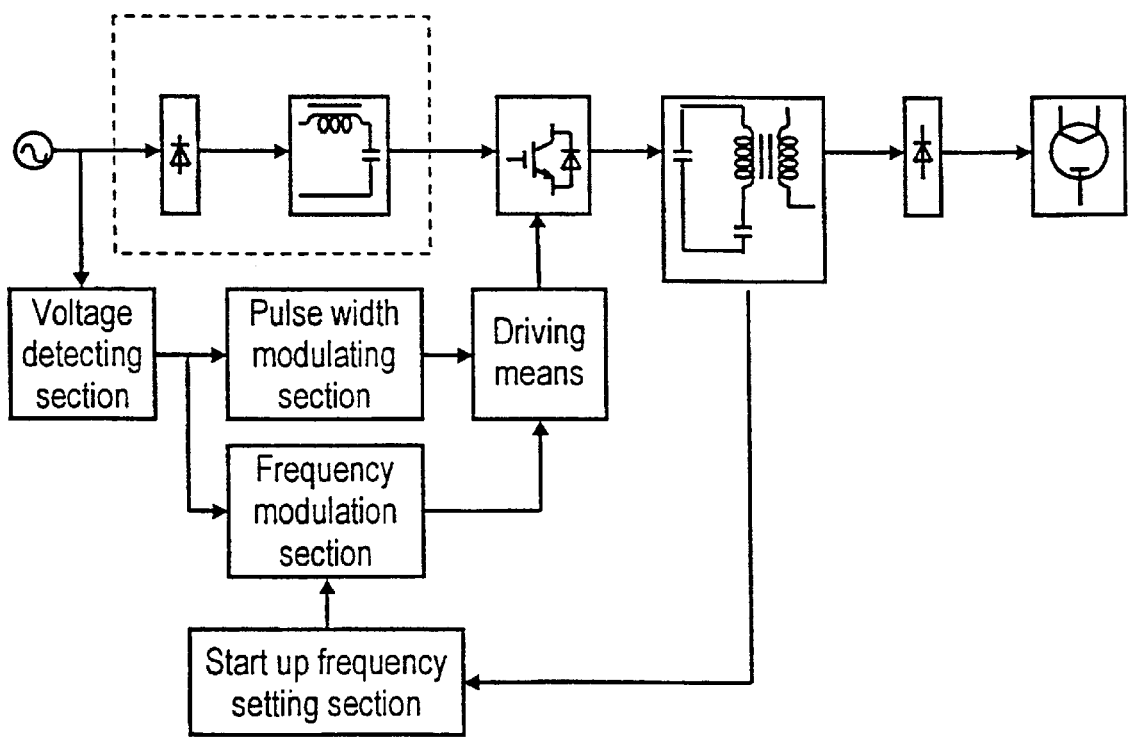
FIG. 13 is a circuit block diagram; where, the circuit of FIG. 11 is added with a start-up frequency setting section, being a content of the invention in embodiment 5.

FIG. 13 is a circuit block diagram showing a structure provided with a frequency modulation section, which produces frequency modulation signal using an output from voltage detection circuit for detecting voltage of a commercial power supply as the base signal. Inside the frequency modulation section, the base signal is reversed and amplified, and the amplification index is partially modified. An output frequency modulation signal is delivered to the driving section, and the driving section drives switching device accordingly.

Figure 12:
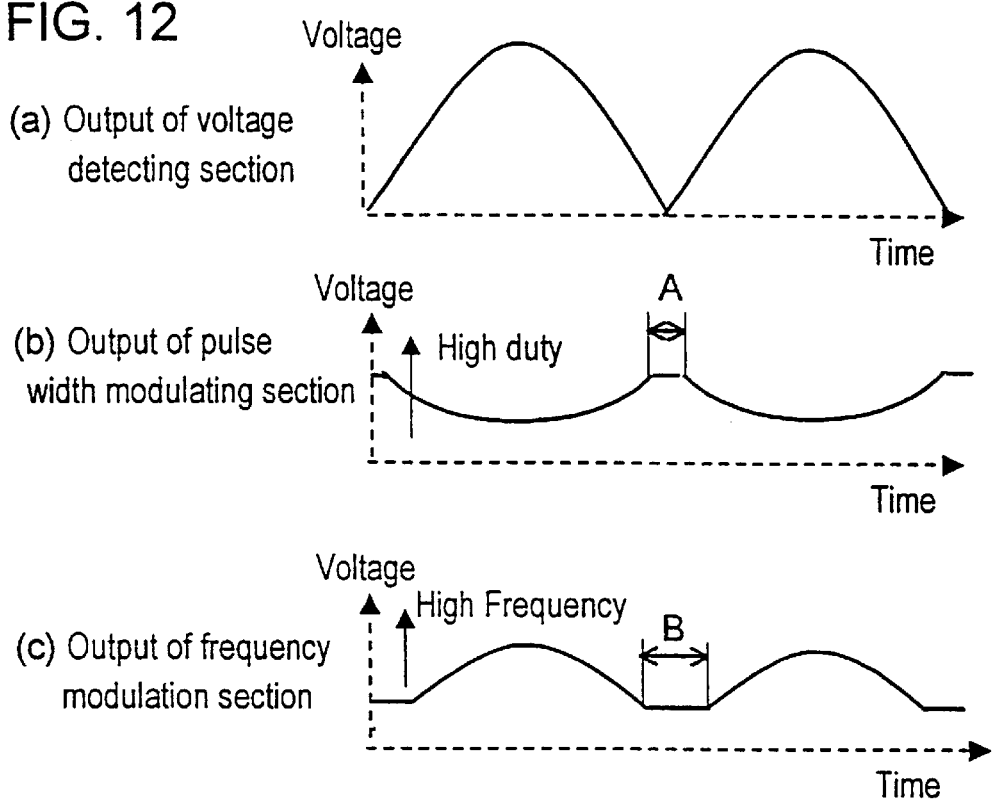
FIGS. 12(a)–12(c) show waveform charts in the circuit of FIG. 11 in embodiment 5.

If the operating frequency comes down lower than 20 kHz, or within an audible frequency band, a sound might be heard from the circuit. In order to avoid this, the frequency modulation section limits the bottom of frequency at approximately 20 kHz. FIG. 12 shows voltage waveform; FIG. 12(a) shows an output from the voltage detection section corresponding to one cycle of commercial power supply, FIG. 12(b) shows a pulse width modulation output, FIG. 12(c) shows a frequency modulation output; the time axes of the above charts are displayed with coincidence. The higher the voltage waveform of pulse width modulation output the greater is the duty for driving the first switching device. The higher the voltage waveform of frequency modulation output the higher is the frequency at which the first switching device is driven. In FIG. 12(c), the period B in the output of frequency modulation section reflects the function of limiting the bottom.

Magnetrons can start operation when a voltage of approximately −4 kV is applied and cathode is heated to 2100° K. It takes some time before cathode temperature reaches 2100° K. For performing a high speed heating, it is essential to reduce the warm-up time as short as possible. A method for this purpose is to provide the cathode with a greatest possible current at the start-up. However, because a coil to generate high voltage (secondary coil 39) and a coil to supply current to cathode (tertiary coil 42) are provided in one leakage transformer 32, providing a great cathode current at the start-up inevitably raises voltage of the secondary coil 39. Then, the rectifying circuit 40 needs to be formed with electric components that have a sufficiently high withstand voltage. The cathode of magnetron 41 is provided with an inductor, impedance Z of the inductor is represented in Formula 5.

$$Z=2\pi fL \quad \text{(Formula 5)}$$

where:
L is inductance
f is frequency.

Therefore, if frequency is lowered at the start-up, the impedance Z is reduced and current flowing to cathode can be increased without a increase in the voltage of secondary coil.

A circuit of the present invention is provided with a start-up frequency setting section for releasing the frequency modulation at the start-up, as shown in FIG. 13, to have the circuit operate on the lowest frequency. The start-up frequency setting section detects the voltage of primary coil, or secondary coil, of leakage transformer for controlling the frequency so that the voltage of primary coil, or secondary coil, is kept constant. Therefore, the output voltage is kept stable even when power supply voltage varies. If the first switching device 36 is put into operation at the same low frequency even after the cathode of a magnetron reaching a temperature ready for starting operation, the magnetron generates an excessive output. In order to avoid this, as soon as a magnetron start operation the start-up frequency setting section is informed. Based on the information, the start-up frequency setting section immediately revives the frequency modulation.

Figure 14:
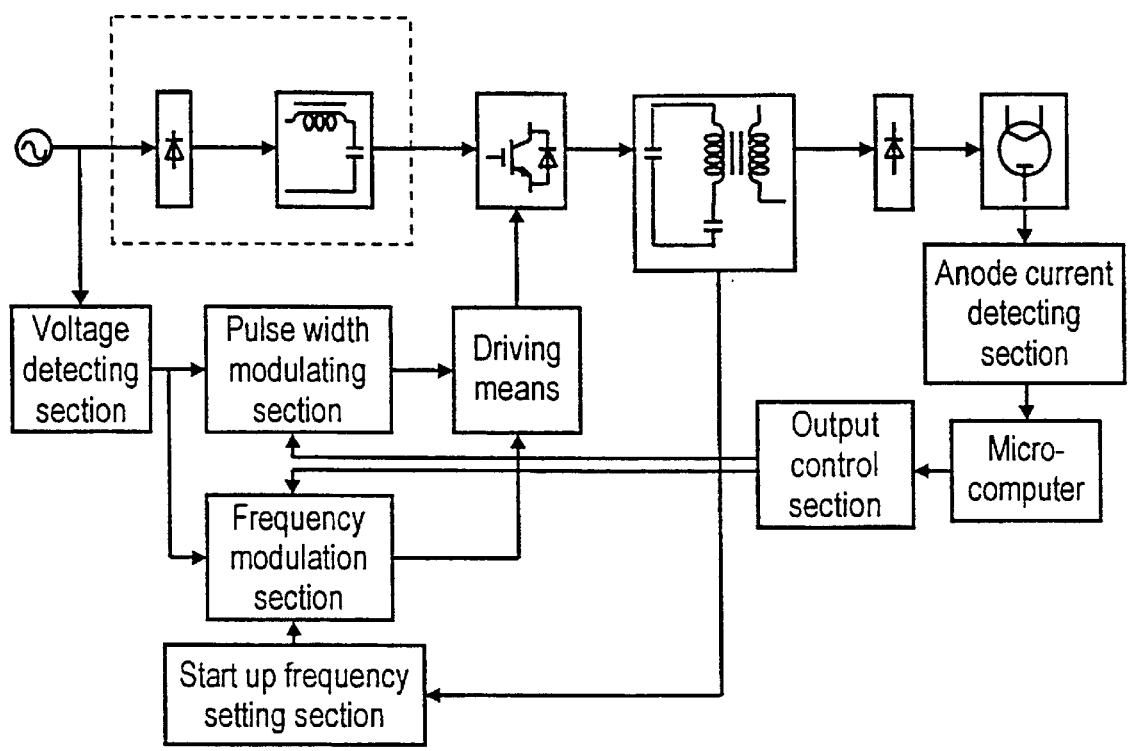
FIG. 14 is a circuit block diagram; where, the circuit of FIG. 13 is added with an output adjustment section, being a content of the invention in embodiment 5.

Output of a magnetron can be recognized from the amount of anode current. In FIG. 14, an anode current detection section is provided for detecting anode current, and information from it is delivered to a microcomputer. The microcomputer controls an output adjustment section for obtaining an output of a certain specific level. The output adjustment section delivers control signal to the frequency modulation section and the pulse width modulation section. When output is to be lowered, the output adjustment section takes action with priority on the pulse width modulation. If it is to be lowered further, action is taken on the frequency modulation.

Figure 15:
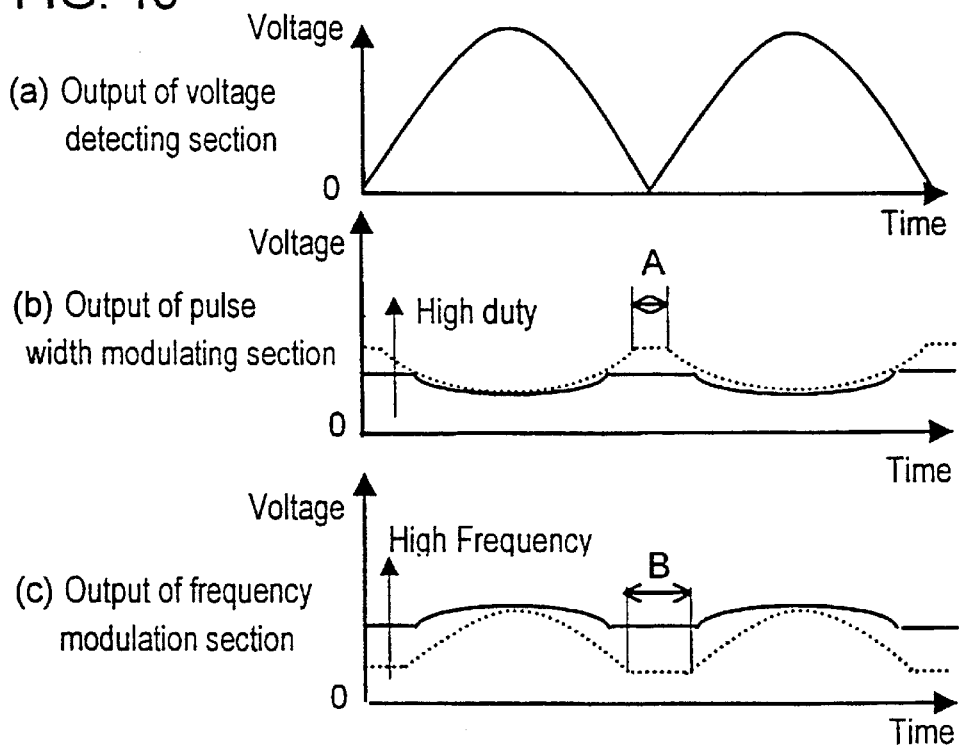
FIGS. 15(a)–15(c) show waveform charts in the circuit of FIG. 14 in embodiment 5.

FIG. 15(a) shows a voltage waveform of an output, which is under the output control, from the voltage detection circuit corresponding to one cycle of commercial power supply, FIG. 15(b) shows a voltage waveform of an output from pulse width modulation circuit, FIG. 15(c) shows a voltage waveform of an output from frequency modulation circuit; the time axes of the above charts are displayed with coincidence. In FIGS. 15(b), (c), dotted line represents the modulation signal at high output, while solid line represents that at low output. For lowering the output, the pulse width modulation section is first put into action so that the voltage waveform takes the shape of dotted line, and then the frequency modulation section is put into action so that the voltage waveform takes the shape of solid line.

By so doing, variation of the cathode current under output control can be made small, and a range of output control can be made broader.

Disorder of a magnetron may be judged from a signal of anode current detection section for detecting output of anode current delivered to a microcomputer. If there is a substantial discrepancy between an output determined by a microcomputer and the signal from anode current detection section, it is suspected that the anode and the cathode could be making a short-circuiting, or they are in open state. In such a case, the microcomputer may issue a stop signal to the output adjustment section.

Sixth Exemplary Embodiment

In the circuit of FIG. 1, the first capacitor 34 is connected in parallel with the second switching device 37, and is connected to the series circuit formed of the second capacitor 35 and the primary coil 33 in series with respect to the first switching device 37. However, these may be connected instead in the following configurations for obtaining the same effect.

Figure 16A:
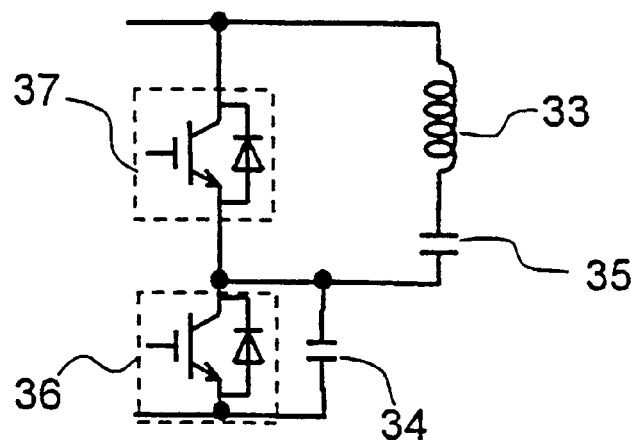
FIGS. 16(a)–16(c) show examples of important circuit diagrams in accordance with a sixth exemplary embodiment.
Figure 16B:
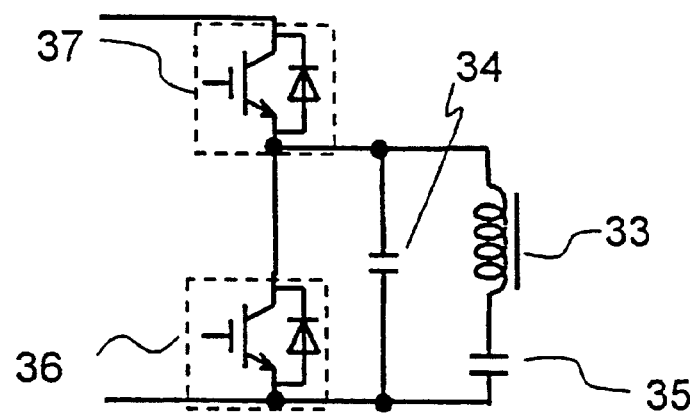
Figure 16C:
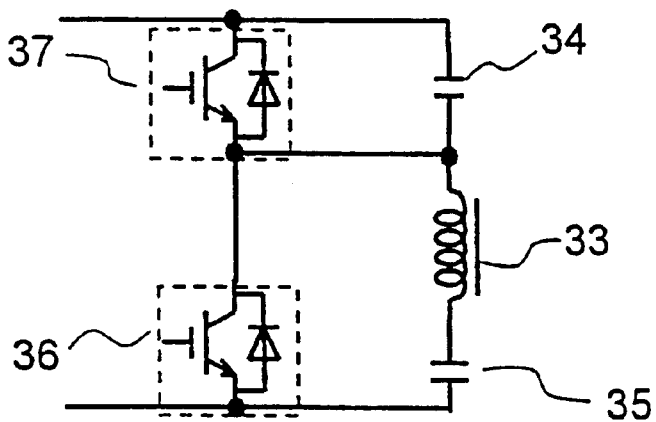

A circuit of FIG. 16(a); the first capacitor 34 is connected in parallel with said first switching device 36, while the series circuit formed of the second capacitor 35 and the primary coil 33 is connected in parallel with the second switching device 37. A circuit of FIG. 16(b); the first capacitor 34 is connected in parallel with the first switching device 36, while the series circuit formed of the second capacitor 35 and the primary coil 33 is connected in parallel with the first switching device 36. A circuit of FIG. 16(c); the first capacitor 34 is connected in parallel with the second switching device 37, while the series circuit formed of the second capacitor 35 and the primary coil 33 is connected in parallel with the first switching device 36.

Seventh Exemplary Embodiment

Referring to FIG. 1, the driving means 38 contains in it an oscillation section for providing drive signal to the first switching device 36 and the second switching device 37. The oscillation section generates signal of a certain specific frequency and duty to be delivered to the first switching device 36 as the drive signal. The second switching device 37 is provided with a reverse signal of the drive signal to first switching device 36 given with a delay time. Therefore, if width of the initial pulse given to the first switching device 36 is made to be the smallest, the second switching device 37 is driven with the greatest pulse width. Assuming the circuit of FIG. 1, in which the first resistor 44 and the second resistor 45 are eliminated, although the first switching device 36 has a great resistance during a standby state, when the first switching device 36 and the second switching device 37 are not in operation, there is a slight leakage current charging the second capacitor 35, the potential of which reaches to the source voltage $V_{DC}$. Collector voltage $V_{CE}$ of the first switching device 36 is 0V. Starting from this state, when the first switching device 36 starts its operation with the smallest pulse width, there will be no change because the collector voltage $V_{CE}$ is 0V. When the second switching device 37 starts its operation with the greatest pulse width, the second capacitor 35 charged to the source voltage $V_{DC}$ discharges through the second semiconductor switching device 37 and the primary coil 33. The discharge current is great as the voltage of second capacitor is as high as the source voltage $V_{DC}$. This creates an overvoltage in the secondary coil 39.

So, a series-connected first resistor 44 and second resistor 45 is connected in parallel with the DC source, the connecting point between first resistor 44 and second resistor 45 is connected to the connecting point between first switching device 36 and second switching device 37. Thereby, voltage $V_{C2}$ of second capacitor 35 is divided at the initial stage to the following.

$$V_{C2}=V_{DC} \times R_1/(R_1+R_2) \quad \text{(Formula 6)}$$

$R_1$: resistance of resistor 44,
$R_2$: resistance of resistor 45

Thus the occurrence of overcurrent and overvoltage is prevented even if apparatus is started at the time of greatest pulse width.

Eighth Exemplary Embodiment

Referring to FIG. 1, a magnetron driving circuit in accordance with an eighth exemplary embodiment is shown. A DC source 31 is formed of a rectifying means 46, an inductor 47 and a third capacitor 43, for rectifying a commercial power supply 49 and delivering it as DC voltage after smoothing. The inductor 47 and the third capacitor 43 form a filter, which reduces a noise generated as a result of switching action of the first switching device 36 and the second switching device 37. In parallel with the output of the filter, or the capacitor 43, a surge absorber 50 is provided. Function of the surge absorber 50 is described in the following.

At the moment when commercial power supply 49 is connected, a voltage approximately twice as high as that of the commercial power supply is generated at the capacitor 43 as a transitional phenomenon caused by the filter. In a case of 240V commercial power supply, the peak value of the voltage reaches □2×240×2=650V. This voltage is applied on the first switching device 36 connected to output of the filter. As described in embodiment 1, the highest voltage in a circuit of the present invention at the first switching device 36 is the DC source voltage $V_{DC}$. With some safety margin to a 240V commercial power supply, a generally available device having 600V withstand voltage is used for the first switching device. A voltage exceeding 600V is not desirable in the circuit. So, a surge absorber 50 is provided between the positive terminal and the negative terminal; in practice, a varistor having a 420–510V varistor voltage is used. The varistor absorbs a voltage exceeding 600V, and no overvoltage is applied on the switching device 36.

Figure 17:
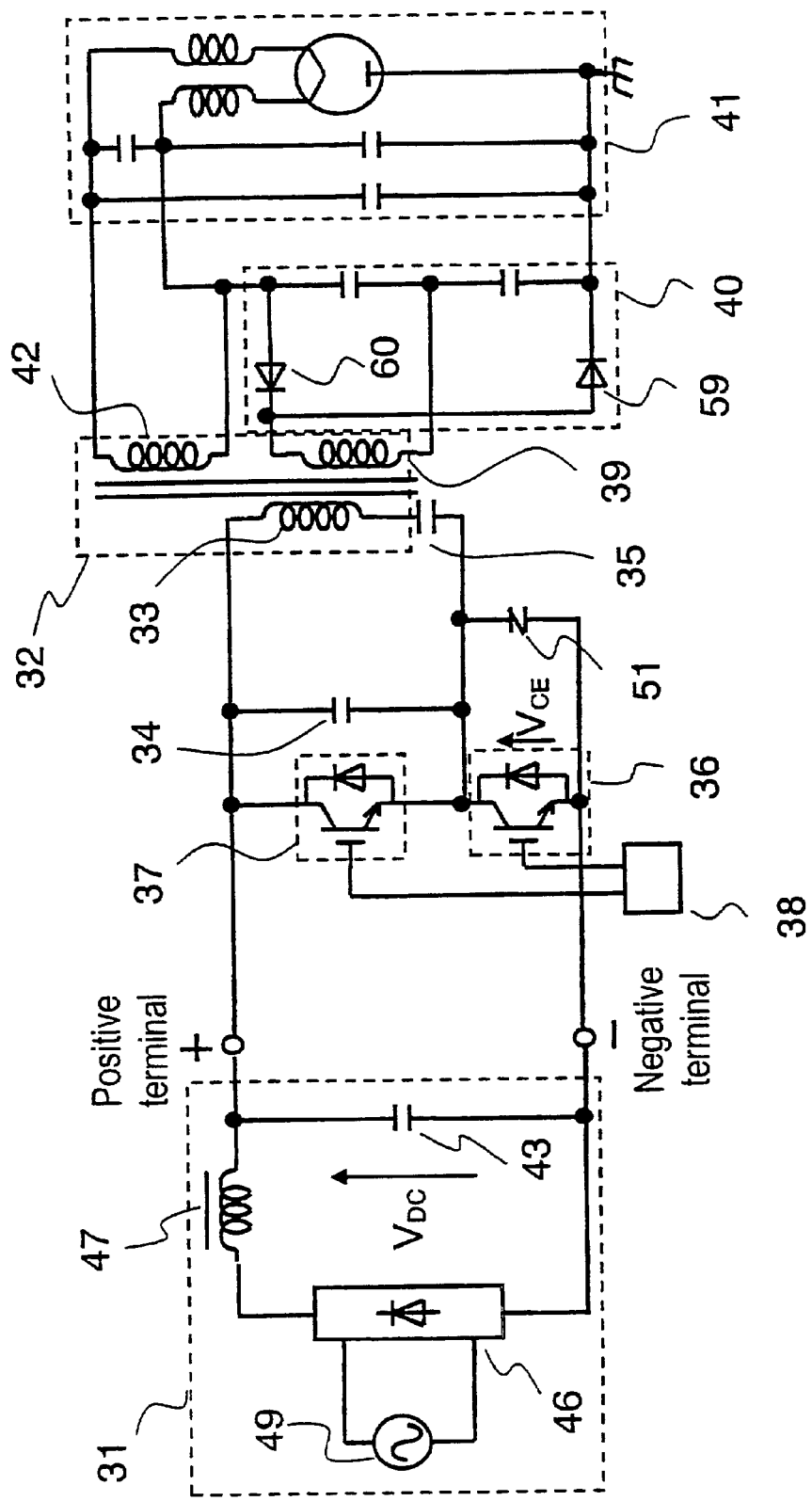
FIG. 17 is a circuit diagram for driving a magnetron in high frequency heating apparatus in accordance with an eighth exemplary embodiment of the present invention.

Instead, a surge absorber 51 may be provided on both ends of the first switching device 36, as shown in FIG. 17.

In the initial state, there is no energy accumulated in the inductor 47, the third capacitor 43, the first capacitor 34, the second capacitor 35 and the leakage transformer 32. When a commercial power supply 49 is connected, a voltage twice as high as that of the commercial power supply emerges at both ends of the third capacitor 43, as described earlier. As the leakage transformer 32 and the second capacitor 35 do not have initial energy, their voltage is zero; the voltage at both ends of the third capacitor 43 is applied on the first switching device 36.

Therefore, a surge absorber 51 connected at both ends of the first switching device 36 provides the same effects as the case where it is connected at the output of the filter.

Ninth Exemplary Embodiment

Figure 18:
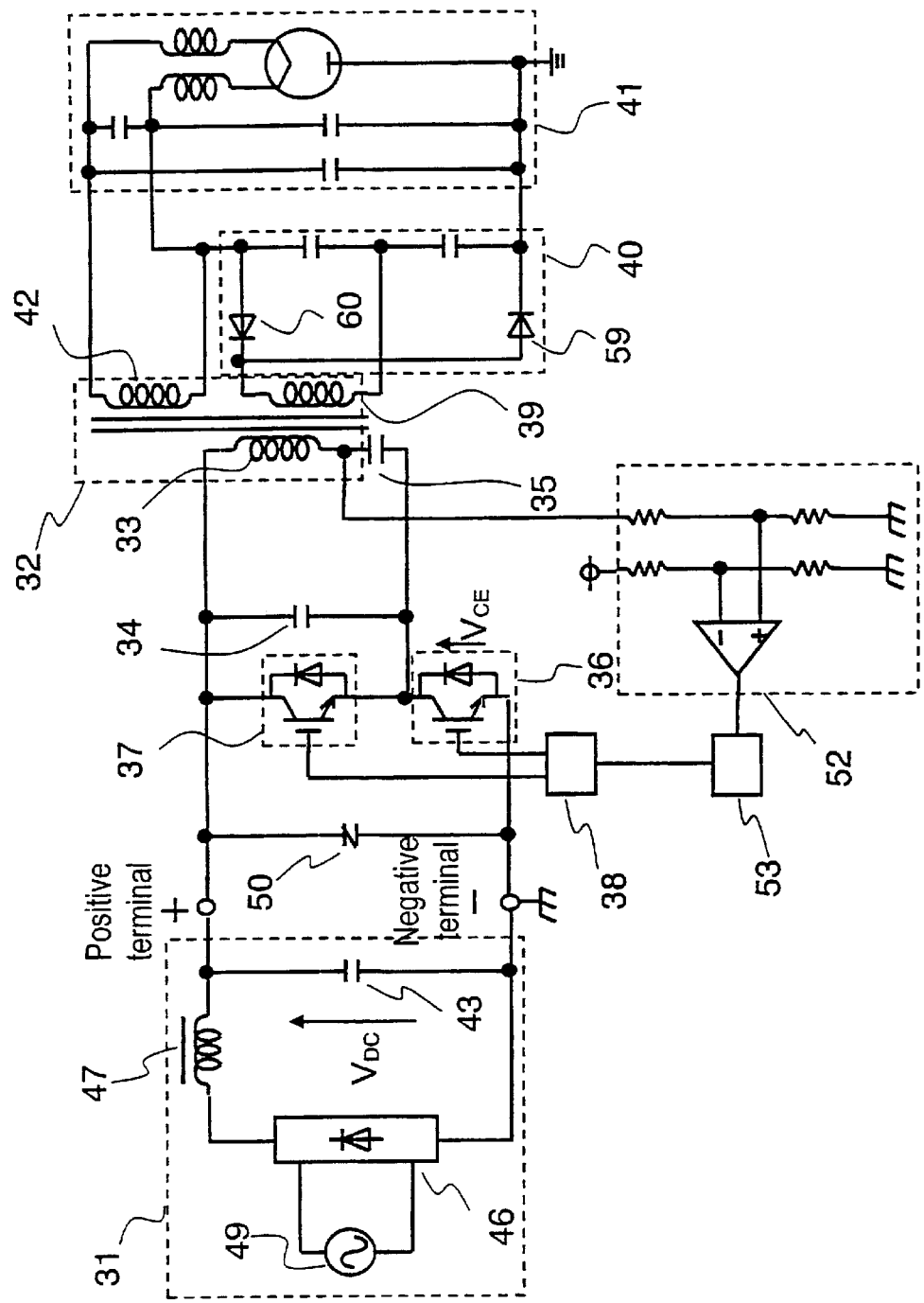
FIG. 18 is a circuit diagram of other combination for driving a magnetron in high frequency heating apparatus in accordance with a ninth exemplary embodiment of the present invention.

FIG. 18 shows a circuit diagram in accordance with a ninth exemplary embodiment of the present invention. A voltage detecting means 52 is provided for detecting a voltage at the point where the primary coil 33 and the second capacitor 35 are connected. Numeral 53 represents stop control means, which delivers a stop control signal to a driving means 38 in accordance with output signal from the voltage detecting means 52.

Figure 19:
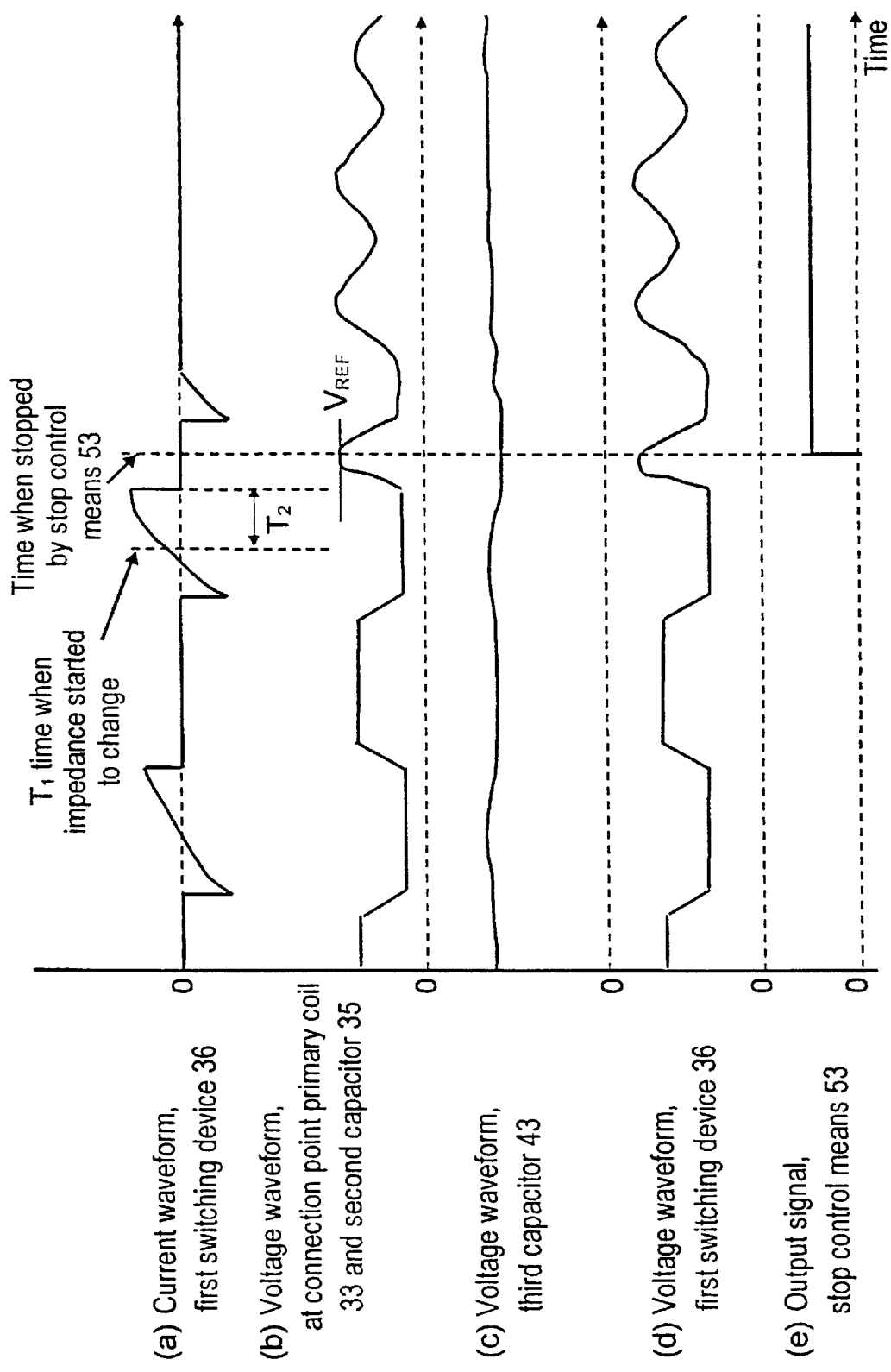
FIG. 19 shows voltage, or current, waveform in electric components at a sudden impedance change bringing a magnetron to a short-circuit state in the embodiment 9.

When a sudden impedance change is occurred by a discharge within a magnetron 41, or by a short-circuit between anode and cathode of a magnetron 41 or in the high voltage section of a full-wave voltage-doubling rectifier circuit 40, or by the like reasons, inductance of primary coil 33 decreases suddenly. FIG. 19 illustrates waveforms in the constituent sections of the circuit under the above described state; FIG. 19(a) shows a current waveform of the first switching device 36, FIG. 19(b) shows a voltage waveform at the connection point of the primary coil 33 and the second capacitor 35, FIG. 19(c) shows a voltage waveform of the third capacitor 43, FIG. 19(d) shows a voltage waveform of the first semiconductor switching device 36, FIG. 19(e) shows an output signal waveform of the stop control means 53. Referring to FIG. 19, an impedance change occurs at time $T_1$, the current flowing in the first switching device 36 starts increasing (a).

As a result, during the period $T_2$ when the first switching device 36 in conduction state, third capacitor 43 discharges its electric charge through primary coil 33 and second capacitor 35 and the voltage goes low. When the first switching device 36 turns OFF with an overcurrent $I_{CP}$ a voltage higher than normal emerges at the first switching device 36 and the connection point of primary coil 33 and second capacitor 35. As soon as the voltage at the connection point of primary coil 33 and second capacitor 35 exceeds a predetermined value $V_{REF}$ (b), it is detected by the voltage detecting means 52 and the stop control means 53 issues a signal (e), which is transferred to the driving means 38 and the operation of first switching device 36 and second switching device 37 is discontinued. Thus, continuous generation of overvoltage/overcurrent is prevented.

Figure 20:
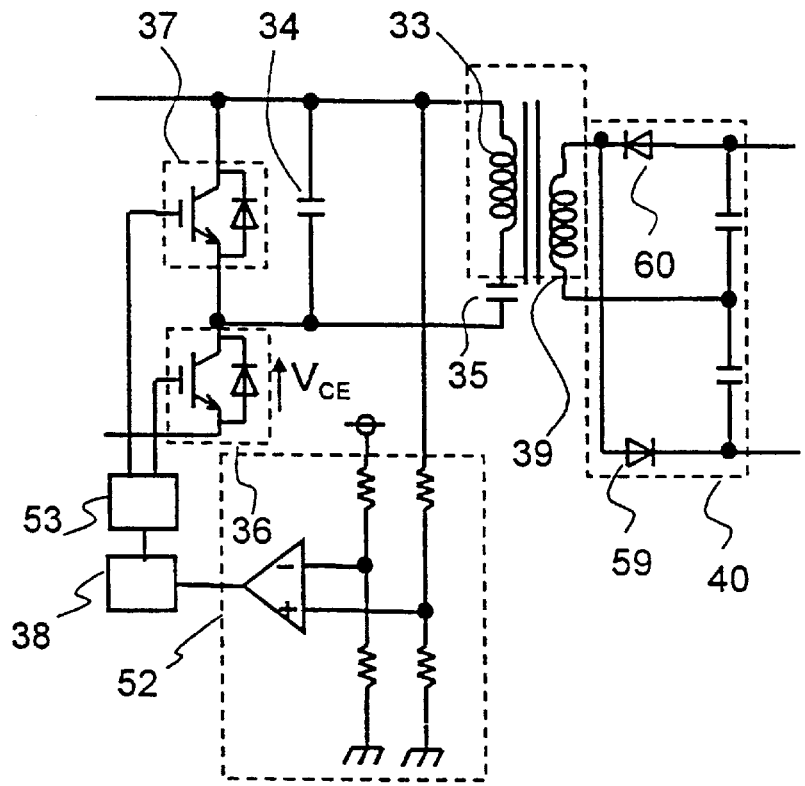
FIG. 20 is a circuit diagram showing the structure of embodiment 9.

The continuous generation of overvoltage/overcurrent in the first switching device 36 and the second switching device 37 may be prevented also through a structure where the point of voltage detection is at the third capacitor 43, as shown in FIG. 20.

Figure 21:
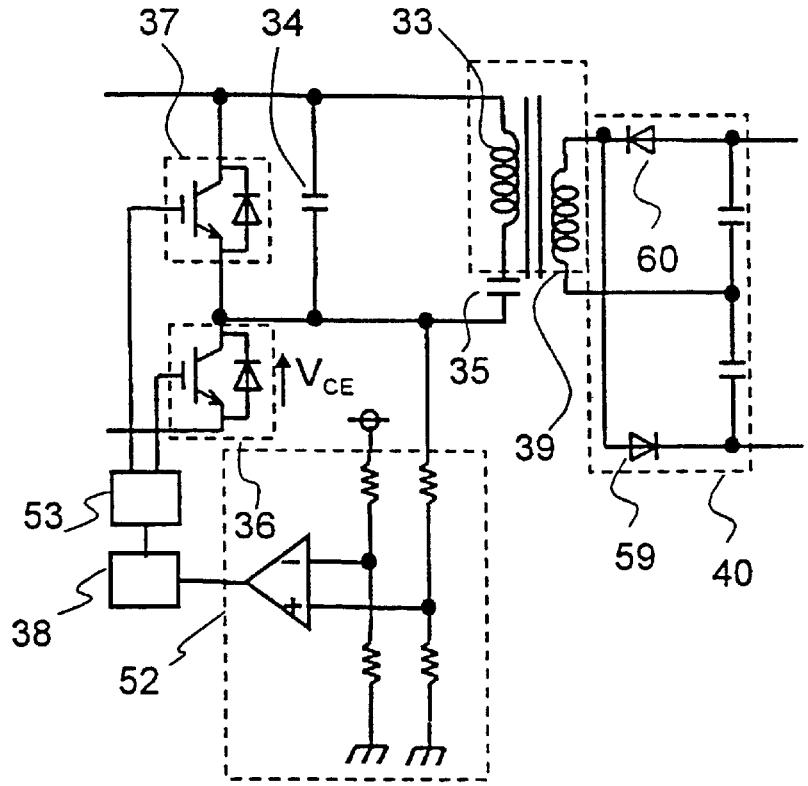
FIG. 21 is a circuit diagram showing other combination of the embodiment 9.

When a sudden impedance change is caused by a short-circuiting between anode and cathode of a magnetron 41 or in the high voltage section of a rectifier circuit 40 or by the like reasons, voltage of the first switching device 36 also tends to go high. Therefore, the continuous overvoltage/ overcurrent on the first switching device 36 and the second switching device 37 may be prevented also through a structure of FIG. 21, where a point of voltage detection is at the first switching device 36.

Tenth Exemplary Embodiment

The anode-cathode impedance of a magnetron is high at the start-up until the cathode temperature reaches an appropriate level. There is a possibility of a high voltage arising between anode and cathode during the period. Therefore, the voltage between anode and cathode needs to be controlled. The voltage between anode and cathode, that of secondary coil 39 are as high as several kilo-volts, and it is difficult to detect them. In the present embodiment, the anode-cathode voltage is controlled based on information obtained through detection of the voltage of primary coil 33, which is closely interrelated with the voltage of secondary coil 39.

Figure 22:
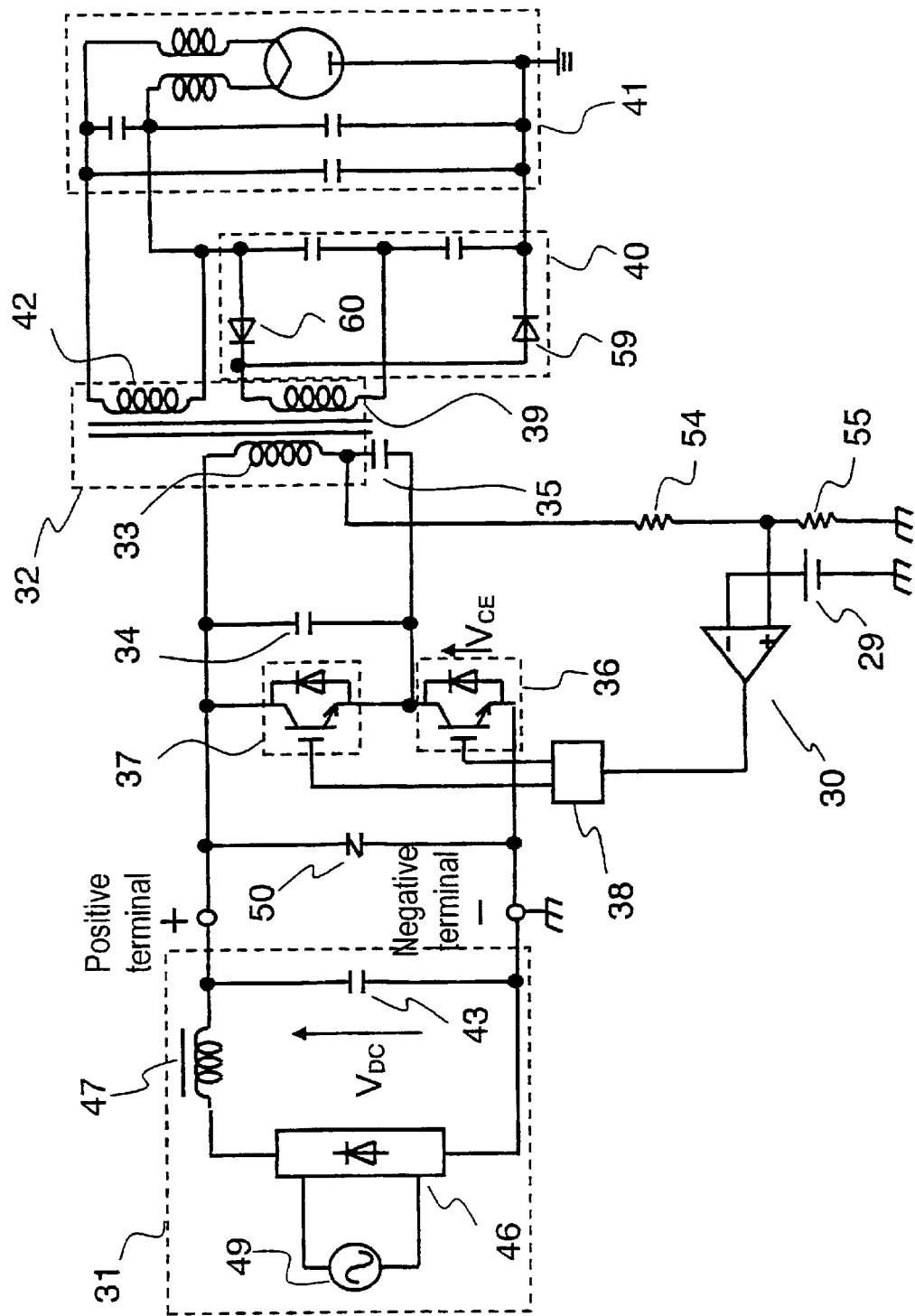
FIG. 22 is a circuit diagram showing the structure of a tenth exemplary embodiment.

A magnetron driving circuit in accordance with a tenth exemplary embodiment is shown in FIG. 22. A third resistor 54 and a fourth resistor 55 are connected in series, one end of which is connected to the connection point of primary coil 33 and second capacitor 35, while the other end is connected to one end of the DC source 31, for the purpose of detecting the voltage of primary coil 33. The fourth resistor 55 is connected to a comparator 30, which compares the voltage of fourth resistor 55 with a reference voltage 29 to control the driving means 38 so that the both voltages are equivalent. Thereby the anode-cathode voltage at the start-up period is controlled to an appropriate value.

The resistors forming the voltage detecting means 52 shown in FIG. 18 in accordance with embodiment 9 may be used in common as the third resistor 54 and the fourth resistor 55.

Eleventh Exemplary Embodiment

Figure 23:
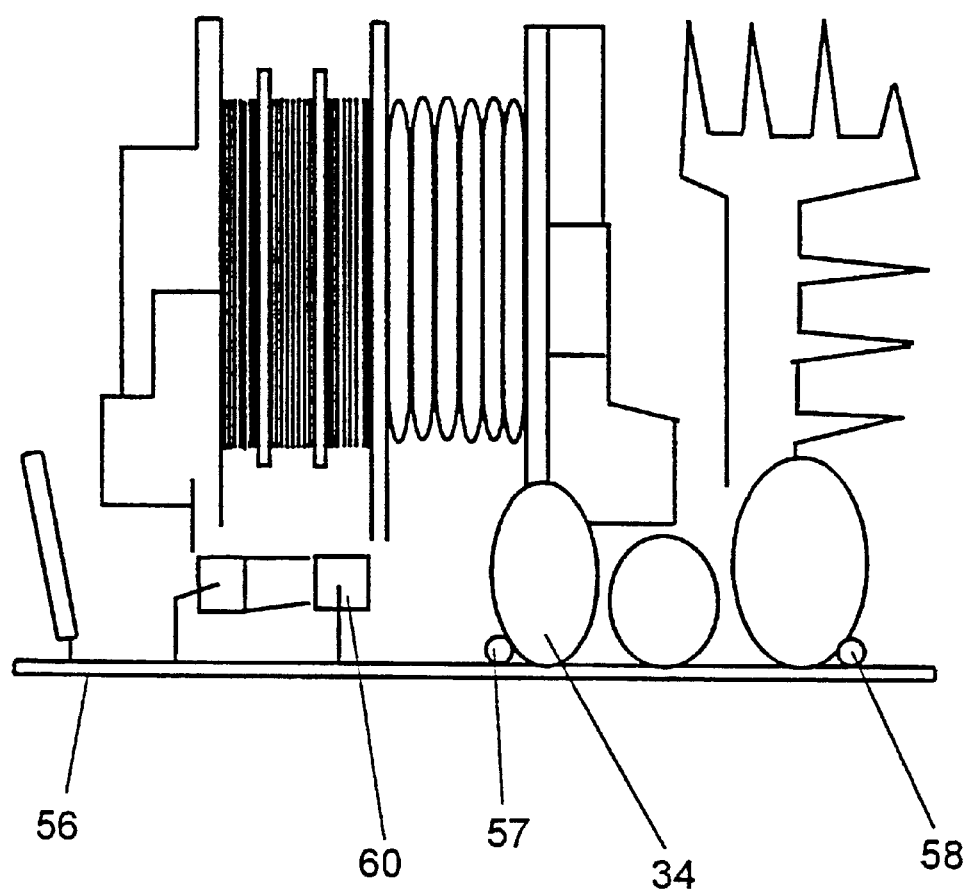
FIG. 23 illustrates how electric components in the circuit diagram of FIG. 1 are mounted on a printed circuit board, used to describe an eleventh exemplary embodiment.

FIG. 23 illustrates appearance of a structure in accordance with an eleventh exemplary embodiment; where, electric components constituting the circuit of FIG. 1 are mounted on a printed circuit board 56.

Anti-toppling means 57, 58 are provided to prevent occurrence of such an accident that an electric component is pushed to become aslant by a casual external force and coming into contact with other electric component. For example, in order to prevent a diode 59, or 60 and the first capacitor 34 from making contact to each other as a result of a casual force accidentally given to, an axial type electric component is disposed at the foot of the first capacitor 34 as anti-toppling means 57. The axial type electric component means electronic components that can be mounted on a circuit board by an automatic mounting machine, having radial lead-wires, and each of the lead-wires are soldered on the printed circuit board 56; therefore, it is hardly toppled or dislocated.

In the present embodiment 11, a first resistor 44 connected in parallel with a first capacitor 34, shown in FIG. 1, is used for the anti-toppling means 57. The first resistor 44 is an axial type 0.5 watt resistor, which is connected in parallel with the first capacitor 34, namely the two components share a same potential, so there will be no problem even if they accidentally come into contact. The resistor 44 is a constituent electronic component forming the circuit. The pattern of the printed circuit board 56 is designed so that the resistor 44 is placed at the foot of the first capacitor 34. Under such an arrangement, even if the first capacitor 34 was pushed, the resistor stops it falling down, and the capacitor will not come into actual contact with the diode 60. When it is possible to place a constituent component in such an arrangement described above, no extra component is needed for the anti-toppling means. No cost of additional components, no additional cost of assembly is required.

Although an axial type component actually functioning in the circuit has been used for the anti-toppling means, an extra dummy resistor of axial type may be used solely for the anti-toppling purpose, if it is difficult to place one of the constituent resistors at a place where the anti-toppling means is to be located. Because such dummy resistors are readily available at low price.

Twelfth Exemplary Embodiment

Figure 24:
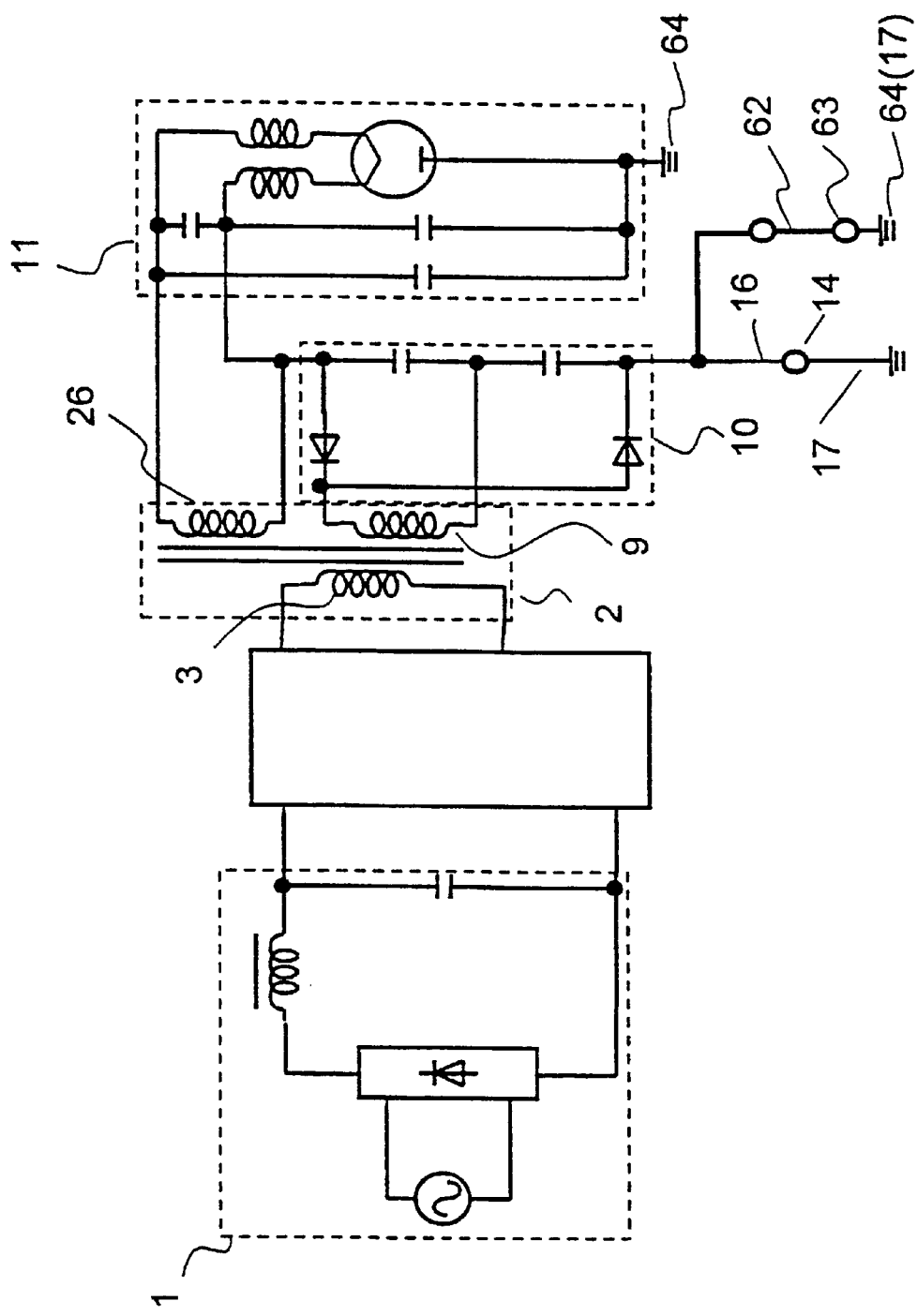
FIG. 24 is a magnetron driving circuit in accordance with a twelfth exemplary embodiment, where provision of a lead wire is taken into account.
Figure 28:
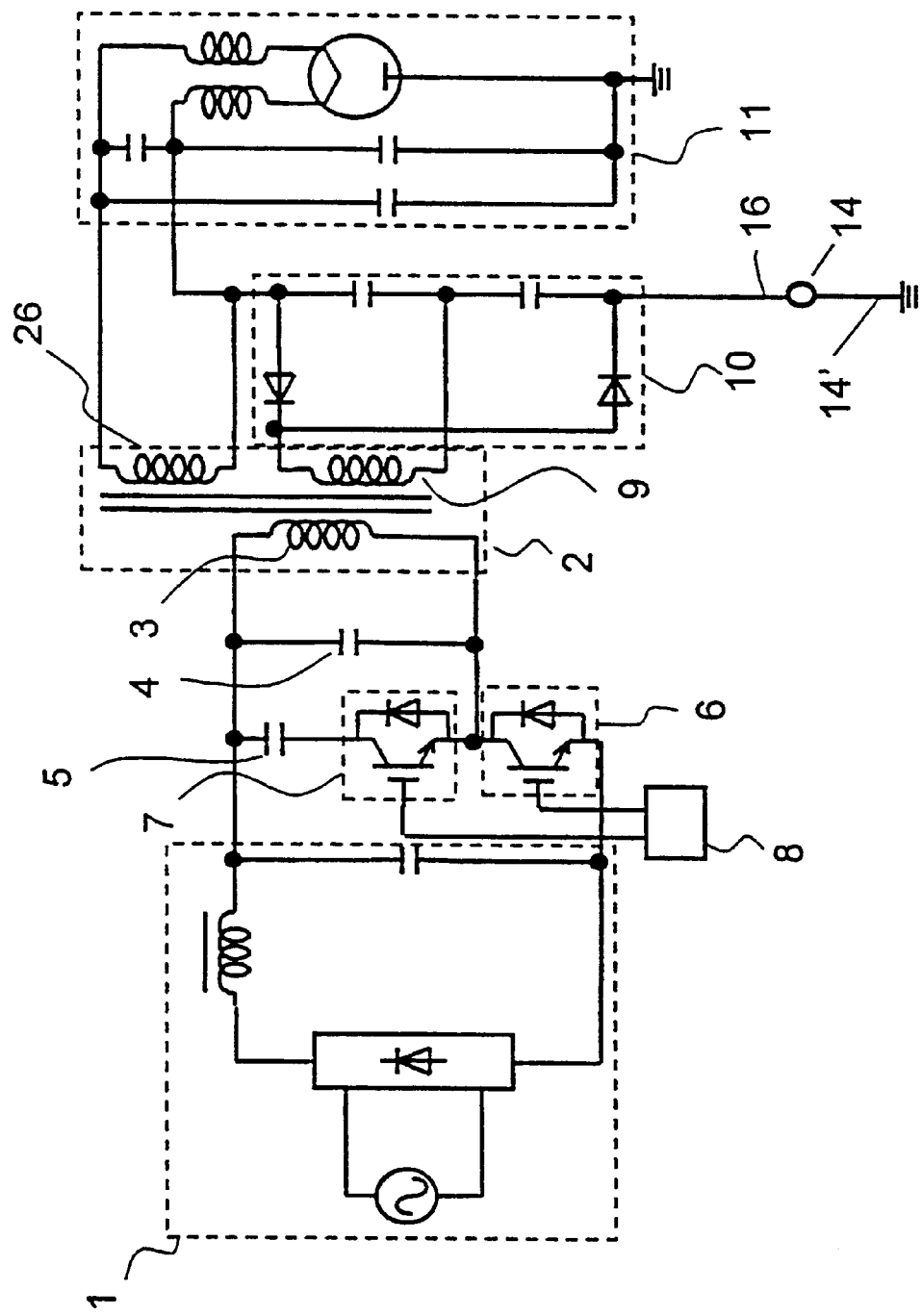
FIG. 28 is a circuit diagram showing a conventional magnetron driving circuit of high frequency heating apparatus.
Figure 29:
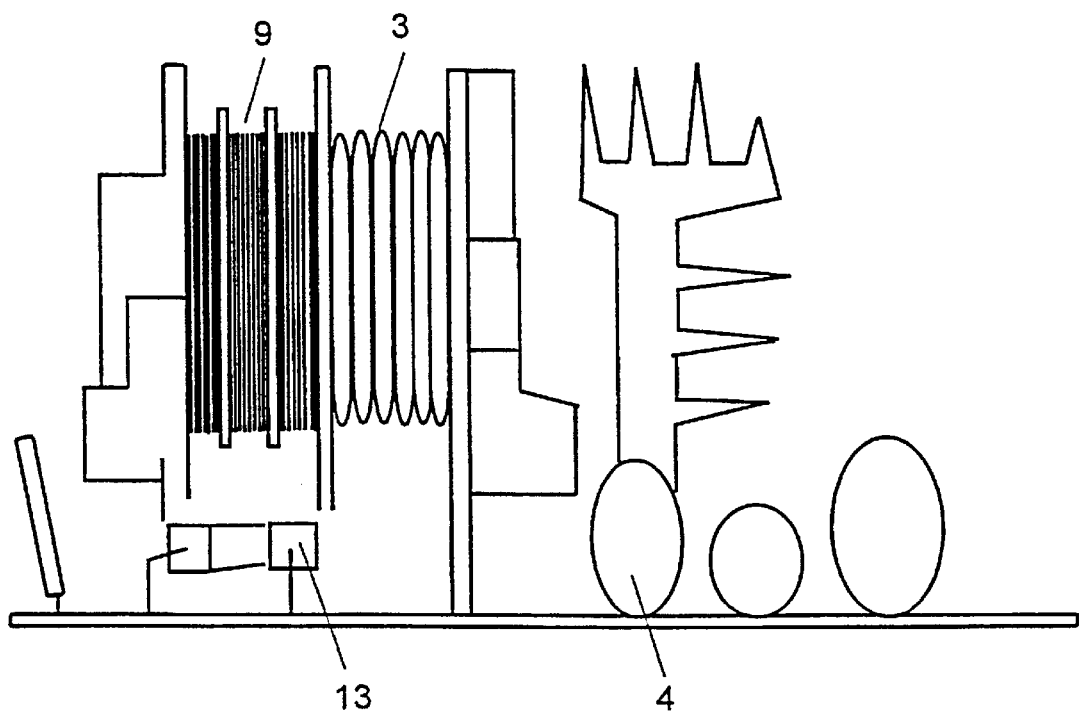
FIG. 29 is an illustration how the electric components of magnetron driving circuit are mounted on a printed circuit board of a conventional high frequency heating apparatus.
Figure 30:
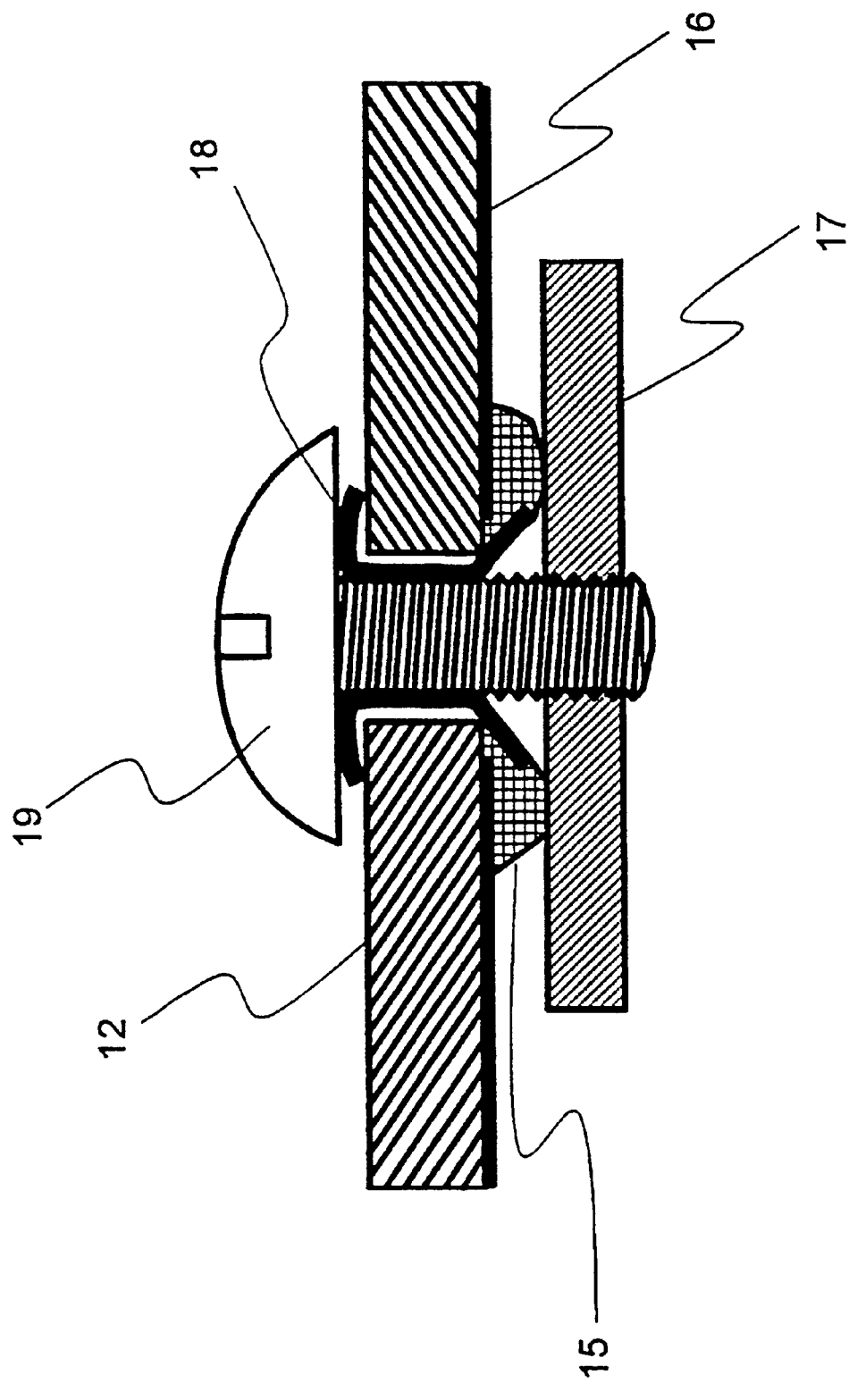
FIG. 30 is a cross sectional view showing a joint portion between a printed circuit board of a magnetron driving circuit and the metal cabinet, or a metal sheet forming part of the metal cabinet, in a conventional high frequency heating apparatus.
Figure 31:
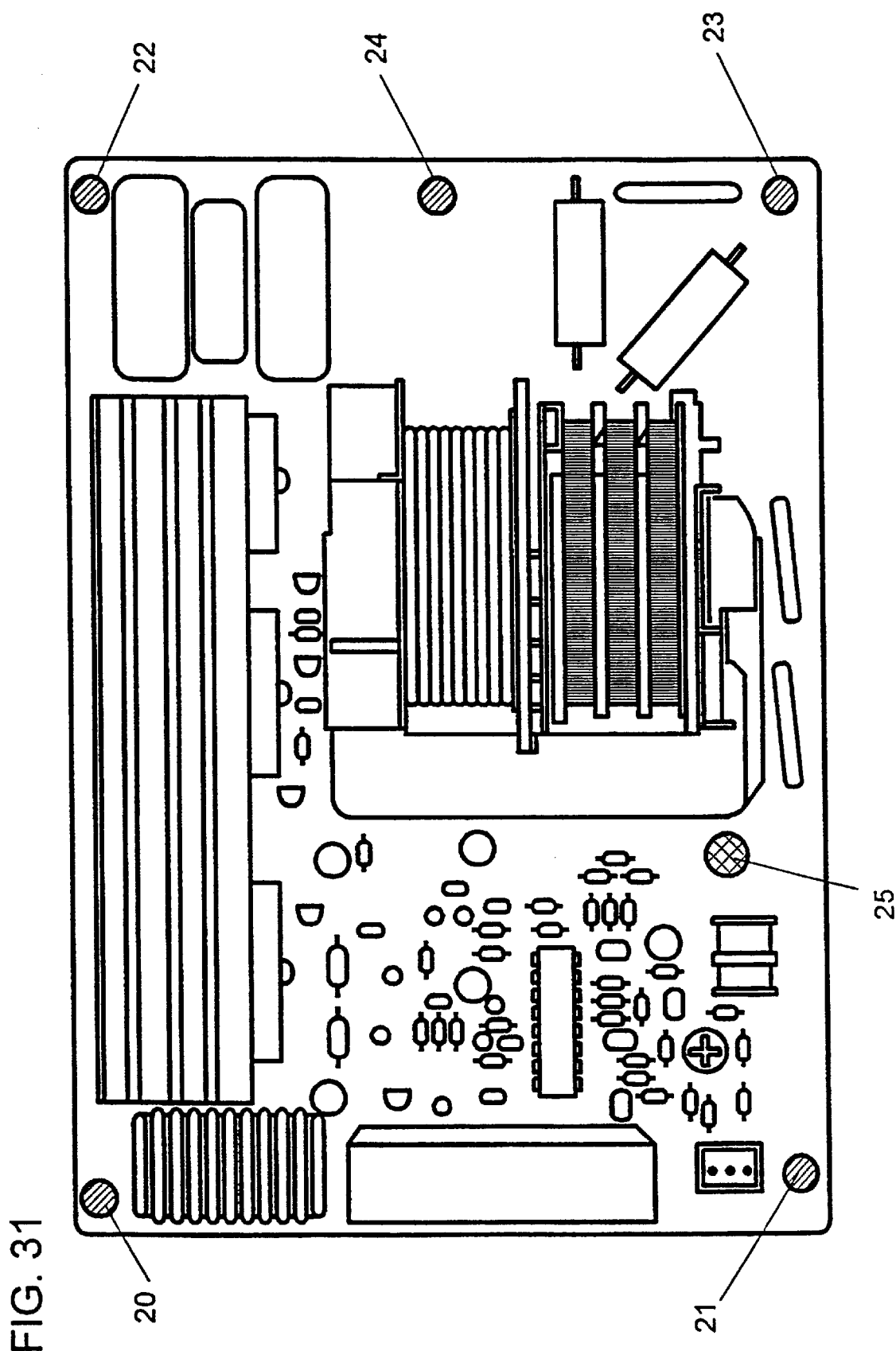
FIG. 31 is a top view of a printed circuit board mounted with electric components of magnetron driving circuit in a conventional high frequency heating apparatus.
Figure 32:
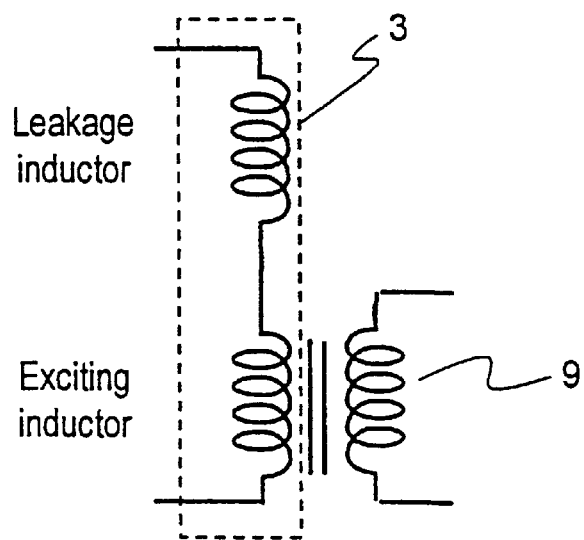
FIG. 32(a) is an equivalent circuit diagram of a leakage transformer.
FIG. 32(b) is an equivalent circuit diagram of a leakage transformer at a time when a magnetron is in a state of short-circuit.
Figure 32B:
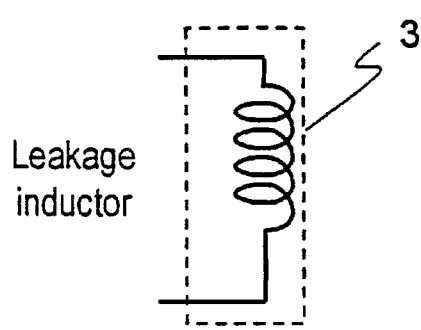

FIG. 24 is a magnetron driving circuit in accordance with a twelfth exemplary embodiment. The portions share the same function in common as in the circuit of FIG. 28 are represented with the same numerals. The portions related to switching devices and capacitors are structured in the same way as in FIG. 1 of embodiment 1, therefore these portions are shown simply in block form. A first connection section 14 is the point of connection between a pattern 16 of printed circuit board and a metal sheet 17, or a metal cabinet 64, of high frequency heating apparatus. These items are connected together by a screw bolt for electrical connection, as illustrated in FIG. 30. In the present invention, an opening 61 is provided in the board at the vicinity of a hole 25 having an eyelet, for the insertion of a lead wire 62 at its one end. The lead wire 62 is soldered to the pattern 16, as shown in FIG. 24.

A second connection section 63 is the other end of the lead wire 62, which is an electrical connecting point to be formed by fastening a terminal provided at the other end of the lead wire 62 to the metal cabinet 64, or the metal sheet 17 of the metal cabinet 64, with a screw bolt.

With the above described configuration, a sure connection between a printed circuit board and the metal cabinet is double-safeguarded by two different types of connections, a first connection section 14 and a second connection section 63. In the actual stage of manufacturing, a forgotten screwing of a bolt in some of the holes of the printed circuit board sometimes occur by negligence of an assembly person.

Figure 25:
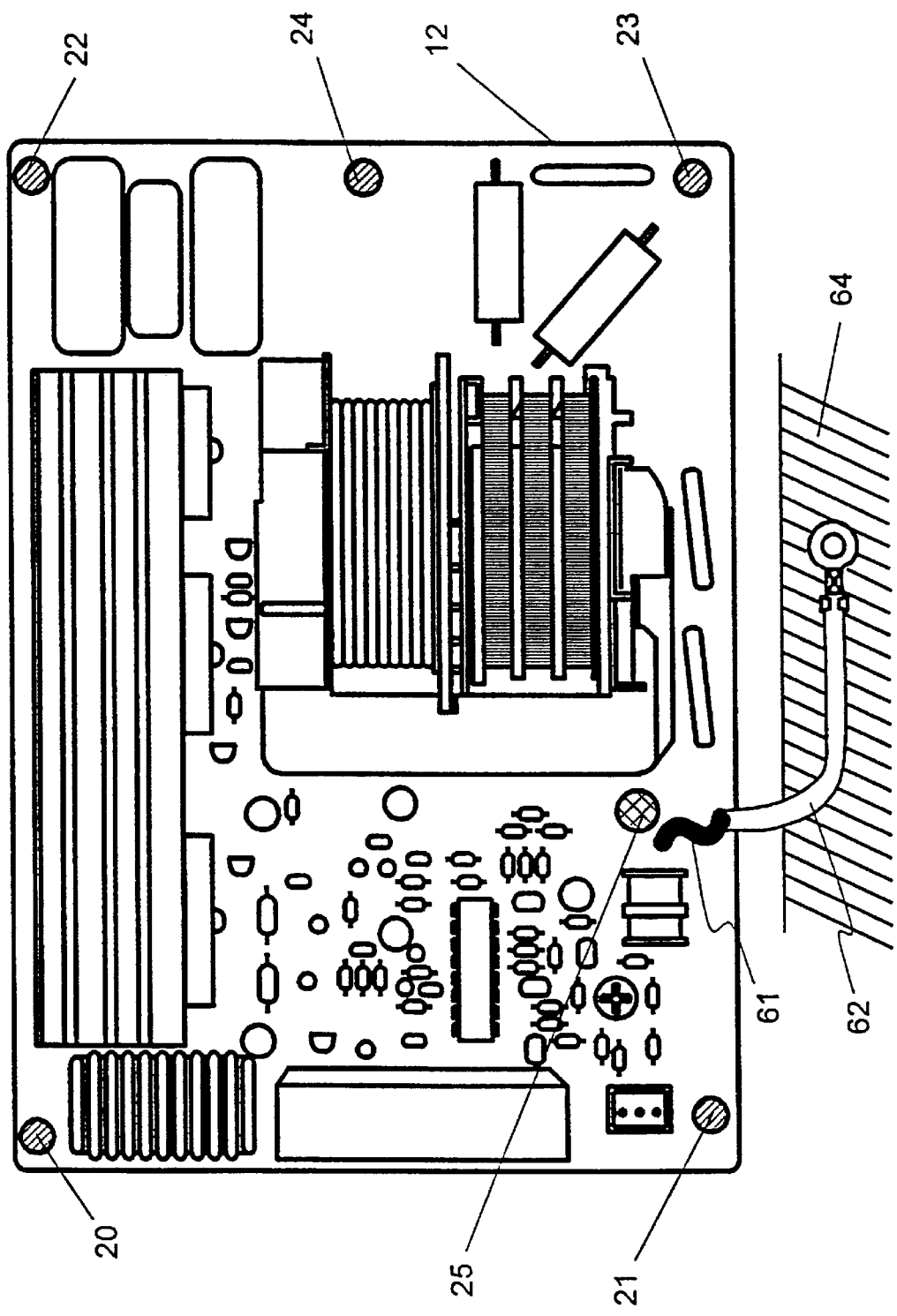
FIG. 25 is an illustration used to describe the embodiment 12, a top view of a printed circuit board mounted with electric components of the magnetron driving circuit.

Referring to FIG. 25, holes 20–24 are for fixing the printed circuit board on a fixing plate with screw bolts. The grounding hole 25 is to be connected to a metal chassis by screwing with a bolt.

Practically, as the holes to be fastened with bolt are spreading in several points on a printed circuit board, it is not easy to recognize each of their location immediately without fail, which could eventually lead to a forgotten fastening by an assembly person. If this happened on the important hole 25 having an eyelet, the result is serious. The lead wire 62 plays a role of locating the important hole. Also, the existence of lead wire keeps assembly person alert not to forget fastening it with a bolt. Thus the sureness of the connection is significantly improved.

Figure 26:
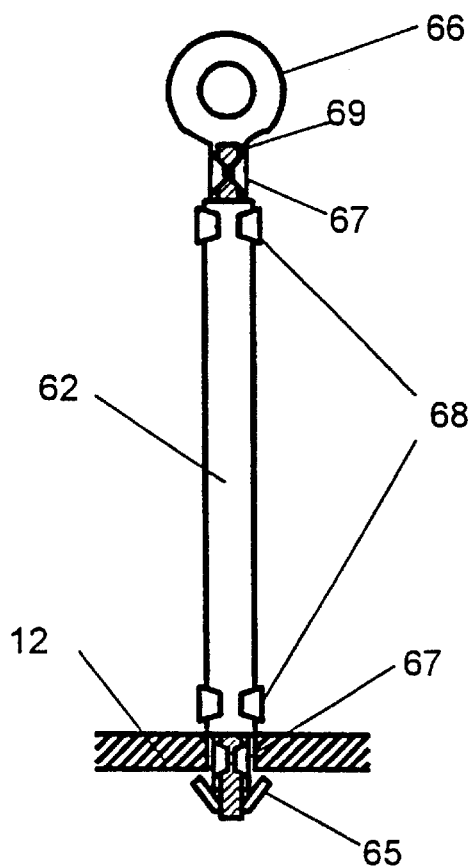
FIG. 26 shows the structure of a lead wire 62 in accordance with the embodiment 12.

FIG. 26 shows structure of a lead wire 62. The lead wire is inserted in a hole of printed circuit board 12 at one end provided with a terminal having a structure as illustrated, called "board-in terminal". A latch mechanism 65 can easily penetrate through a hole as its outer member having an elastic property is bent by the circumferential edge of the hole; after it penetrated through the hole the once-bent latch mechanism expands again by the spring action and the lead wire can not be pulled off. The other end of the lead wire is provided with a round terminal 66. So, once a lead wire 62 is mounted by insertion in a printed circuit board, it will not fall off even if it is accidentally pulled during assembly process by a casual hand of an assembly person. After the board-in terminal is soldered to the printed circuit board 12, the lead wire 62 can withstand a substantial pulling force and stays for sure on the printed circuit board 12 keeping a sure connection thereon.

The lead wire 62 is clamped in the copper wire 69 by a copper wire clamp plate 67; in addition, it is clamped on the coat by a coat clamp plate 68. This structure protects the copper wire 69 from being bent and broken by a bending stress applied repeatedly on the area stripped off the coat.

Figure 27:
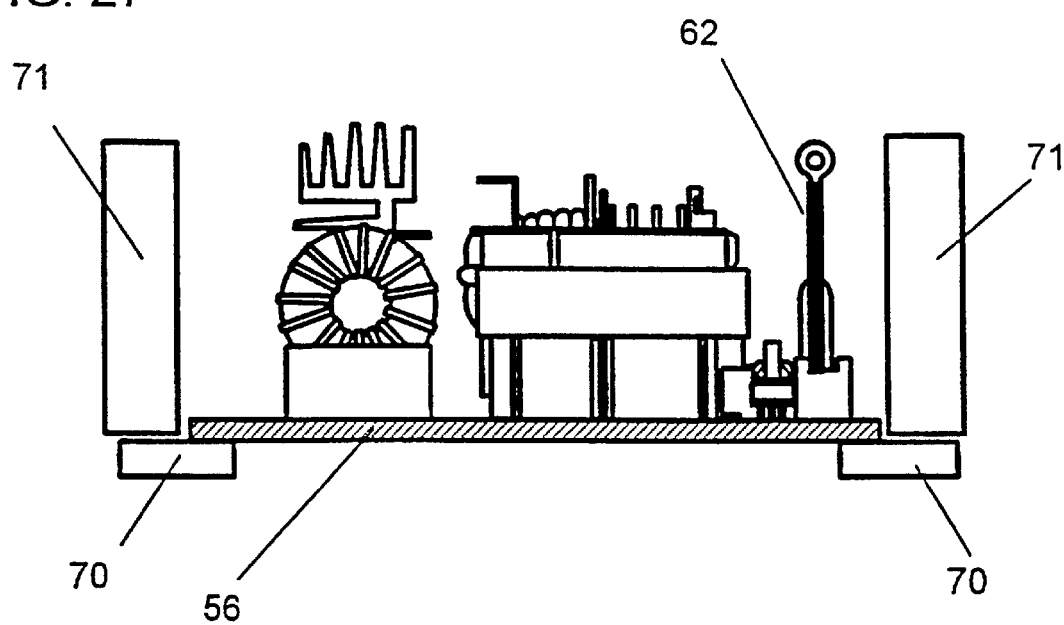
FIG. 27 is an illustration used to describe the soldering operation of a printed circuit board mounted with the electric components of magnetron driving circuit of the embodiment 12.

FIG. 27 illustrates how a printed circuit board of magnetron driving circuit is transferred to soldering process, as viewed from the side. A printed circuit board 56 is placed at its side on a conveyer 70 to be carried to a solder bath. A barrier 71 regulates positioning of the printed circuit board 56 in the horizontal direction so that it does not fall off the conveyor 70. While a printed circuit board is undergoing such procedure, the lead wire 62 can keep on standing upright by itself so as not going to tilt or bend outside of the transportation area, if thickness of the core wire, stiffness of the coat, and such other factors of lead wire 62 are optimized. The bent or fallen lead wire may be blocked by the conveyor 70 or the barrier 71 inviting troubles. So, the standing lead wire would contribute to improve the productivity in the practical manufacturing process.

INDUSTRIAL APPLICABILITY

In a circuit of the present invention, the switching loss of switching devices is reduced by taking advantage of the resonance circuit system. Furthermore, the voltage applied to the switching devices can be controlled so as it does not going higher than the DC source voltage. As a result, in a circuit where the DC source derives from a commercial power supply of approximately 200V to 240V, a semiconductor device of approximately 600V withstand voltage, for example IGBT, MOS, can be used.

According the circuit of the present invention, a leakage transformer used in a magnetron driving circuit whose DC source derives from a 100V, or 120V commercial power supply can also be used for the 200V to 240V commercial power supply.

With a commercial power supply from 200V to 240V, the current characteristics in a range between 20 kHz to 40 kHz can be made approximately identical by increasing the capacitance of second capacitor along with the increasing voltage of the commercial power supply. Therefore, it is not necessary to change the constant of the leakage transformer; a same leakage transformer may be used in common.

Because the peak value of anode current, which is a decisive factor to the life time of a magnetron, can be controlled not to be greater than approximately 1.2 A, a long life of a magnetron is assured.

Providing a start-up frequency setting section, the cathode current can be increased without inviting an increased voltage of secondary coil. Cathode temperature quickly reaches a certain predetermined level, and the magnetron will be quickly ready for operation.

Utilizing an axial component that is a constituent component disposed on the same printed circuit board as an anti-toppling tool for preventing electric components from making physical contact to each other makes the assembly operation easier and inexpensive. Also the overall size of a printed circuit board may be reduced.

The connection with the lead wire between the metal cabinet and the printed circuit board provides a double safety in the electrical connection. This enhances the reliability.

As a results of the above, highly reliable, non-expensive and easy to produce high frequency heating apparatus can be obtained.

What is claimed is:

1. A high frequency heating apparatus comprising:
    a DC source (31),
    a leakage transformer (32) connected to the positive terminal (+) of said DC source (31),
    a second capacitor (35) connected in series to primary coil (33) of said leakage transformer (32),
    a second switching device (37) connected to the positive terminal (+) of said DC source (31),
    a first capacitor (34) connected in parallel with said second switching device (37),
    a first switching device (36) connected in series to said second switching device (37), also connected to the negative terminal (−) of said DC source (31),
    driving means (38) for driving said first switching device (36) and said second switching device (37),
    rectifying means (40) connected with secondary coil (39) of said leakage transformer (32), and
    a magnetron (41) connected with said rectifying means (40).

2. The high frequency heating apparatus of claim 1, wherein the second capacitor (35) is provided with a great capacitance for enabling the output control through pulse width.

3. The high frequency heating apparatus of claim 1, wherein
    the mutual relationship among capacitance $C_2$ of second capacitor (35), primary coil (33) inductance $L_1$ of leakage transformer (32), resonance frequency $f_R$ given in $$f_R = \frac{1}{2 \cdot \pi \cdot \sqrt{L_1 \cdot C_1}},$$

and operating frequency $f_0$ of driving means (40) satisfy $$2.45 < \sqrt{L_1 \cdot C_1} < 3.55$$
    $$1.38 < \frac{f_0}{f_R} < 4.$$

4. The high frequency heating apparatus of claim 1, wherein a series circuit formed of said first capacitor (34), said second capacitor (35) and said leakage transformer (32) assumes either one of the following structures:
    (1) said first capacitor (34) is connected in parallel with said second switching device (37), and a series circuit of said second capacitor (35) and primary coil (33) of said leakage transformer (32) is connected in parallel with said second switching device (37), (2) said first capacitor (34) is connected in parallel with said first switching device (36), and a series circuit of said second capacitor (35) and said primary coil (33) is connected in parallel with said second switching device (37), (3) said first capacitor (34) is connected in parallel with said first switching device (36), and a series circuit of said second capacitor (35) and said primary coil (33) is connected in parallel with said first switching device (36), or (4) said first capacitor (34) is connected in parallel with said second switching device (37), and a series circuit of said second capacitor (35) and said primary coil (33) is connected in parallel with said first switching device (36).

5. The high frequency heating apparatus recited in one of claims 1 through 4, deriving the DC source (31) from a rectified commercial power supply of 200V to 240V, wherein the higher the voltage of said commercial power supply the greater is the capacitance value of second capacitor (35), while constant of the leakage transformer (32) remains the same.

6. The high frequency heating apparatus recited in one of claims 1 through 4, comprising a DC source (31) derived from a rectified commercial power supply, a voltage detection section (52) for detecting voltage of said DC source (31), and a pulse width modulation section which uses output of said voltage detection section as the base signal, wherein signal from said pulse width modulation section is delivered to driving means (38), and said driving means (38) drives switching device (36, 37) in accordance with said signal.

7. The high frequency heating apparatus of claim 6, wherein the pulse width modulation section is provided with a limiting function for setting an upper limit on the duty.

8. The high frequency heating apparatus of claim 6, wherein magnetron (41) output is controlled through both the pulse width modulation and the frequency modulation, with a priority placed on the output control through pulse width modulation to the output control through frequency modulation.

9. The high frequency heating apparatus recited in one of claims 1 through 4, comprising a DC source (31) derived from a rectified commercial power supply, a voltage detection section (52) for detecting voltage of said DC source (31), and a frequency modulation section which uses output from said voltage detection section as the base signal, wherein signal from said frequency modulation section is delivered to driving means (38), and said driving means (38) drives switching device (36, 37) in accordance with said signal.

10. The high frequency heating apparatus of claim 9, wherein the frequency modulation section is provided with a limiting function for setting a bottom limit to the frequency.

11. The high frequency heating apparatus of claim 9, further comprising a start-up frequency setting section for releasing the frequency modulation at the start-up period to perform the control at a fixed frequency.

12. The high frequency heating apparatus of claim 11, wherein the frequency modulation is applied as soon as the magnetron (41) starts operation.

13. The high frequency heating apparatus of claim 9, wherein magnetron (41) output is controlled through both the pulse width modulation and the frequency modulation, with a priority placed on the output control through pulse width modulation to the output control through frequency modulation.

14. The high frequency heating apparatus recited in one of claims 1 through 4, wherein a series-connected first resistor (44) and second resistor (45) is connected in parallel with said DC source (31), and the connecting point of said first resistor (44) and said second resistor (45) is connected to the connecting point of said first switching device (36) and said second switching device (37).

15. The high frequency heating apparatus recited in one of claims 1 through 4, wherein said DC source (31) further comprises an anti-toppling device (57) provided at the foot of circuit components mounted on a printed circuit board (56), aiming for preventing said circuit components from toppling and making contact with other circuit components that have different potential.

16. The high frequency heating apparatus of claim 15, wherein one of the constituent circuit components is used also for the anti-toppling device (57).

17. The high frequency heating apparatus of claim 1, comprising a DC source (31) formed of rectifying means (46), and a filter composed of an inductor (47) and a third capacitor (43) for smoothing the output of said rectifying means (46), further comprising a surge absorber (50) at the output end of said filter (43, 47).

18. The high frequency heating apparatus of claim 1, comprising a DC source (31) formed of rectifying means (46), and a filter composed of a inductor (47) and a third capacitor (43) for smoothing the output of said rectifying means (46), further comprising a surge absorber (50) connected parallel to said semiconductor device.

19. The high frequency heating apparatus of claim 1, including voltage detecting means (52) and stop control means (53), wherein said voltage detecting means (52) detects voltage at the point of connection of primary coil (33) of said leakage transformer (32) and said second capacitor (35) connected in series, and delivers signal to said stop control means (53), said stop control means (53) stops said driving means (38) in accordance with the signal.

20. The high frequency heating apparatus of claim 19, wherein said voltage detecting means (52) detects output voltage of said capacitor (43) of said DC source (31).

21. The high frequency heating apparatus of claim 19, wherein said voltage detecting means (52) detects voltage to be applied on said first switching device (36).

22. The high frequency heating apparatus of claim 1, further including a series circuit of third resistor (54) and fourth resistor (55) provided between the connection point of said leakage transformer (32) and second capacitor (35) and the negative terminal (−) of said DC source (31).

23. The high frequency heating apparatus of claim 22, further comprising a comparator (30) connected to said fourth resistor (55), wherein said comparator compares the voltage of said fourth resistor (55) with a reference value and controls said driving means (38).

* * * * *

UNITED STATES PATENT AND TRADEMARK OFFICE
CERTIFICATE OF CORRECTION

PATENT NO.    : 6,362,463 B1
DATED         : March 26, 2002
INVENTOR(S)   : Bessyo et al.

It is certified that error appears in the above-identified patent and that said Letters Patent is hereby corrected as shown below:

<u>Title page,</u>
Item [75], Inventors, "Hiokaki Moriya" should read -- Hideaki Moriya --.

Signed and Sealed this

Fifth Day of August, 2003

JAMES E. ROGAN
*Director of the United States Patent and Trademark Office*